(12) United States Patent
Wu et al.

(10) Patent No.: US 12,113,075 B2
(45) Date of Patent: Oct. 8, 2024

(54) DISPLAY PANEL AND DISPLAY DEVICE

(71) Applicant: Hubei Yangtze Industrial Innovation Center Of Advanced Display Co., Ltd., Wuhan (CN)

(72) Inventors: Yaodong Wu, Shanghai (CN); Qijun Yao, Shanghai (CN); Shuang Wang, Shanghai (CN); Zhe Li, Shanghai (CN)

(73) Assignee: Hubei Yangtze Industrial Innovation Center Of Advanced Display Co., Ltd., Wuhan (CN)

( * ) Notice: Subject to any disclaimer, the term of this patent is extended or adjusted under 35 U.S.C. 154(b) by 731 days.

(21) Appl. No.: 17/386,354

(22) Filed: Jul. 27, 2021

(65) Prior Publication Data

US 2021/0358963 A1    Nov. 18, 2021

(30) Foreign Application Priority Data

Feb. 9, 2021    (CN) .......................... 202110181905.3

(51) Int. Cl.
| | |
|---|---|
| *G06F 1/18* | (2006.01) |
| *G06F 1/16* | (2006.01) |
| *G06F 3/041* | (2006.01) |
| *G06F 3/044* | (2006.01) |
| *G09G 3/3233* | (2016.01) |
| *H01L 27/12* | (2006.01) |
| *H10K 59/35* | (2023.01) |
| *H10K 59/40* | (2023.01) |

(52) U.S. Cl.
CPC ............ *H01L 27/124* (2013.01); *G06F 1/189* (2013.01); *G06F 3/044* (2013.01); *G09G 3/3233* (2013.01); *H10K 59/40* (2023.02); *G06F 1/1698* (2013.01); *G06F 3/0412* (2013.01); *G06F 3/04164* (2019.05); *G06F 2203/04112* (2013.01); *G09G 2300/0452* (2013.01); *G09G 2354/00* (2013.01); *H10K 59/352* (2023.02)

(58) Field of Classification Search
CPC ..... G06F 3/0412; G06F 3/0416–04186; G06F 3/044–0448; G06F 2203/04112; G09G 2300/0452
See application file for complete search history.

(56) References Cited

U.S. PATENT DOCUMENTS

| | | | |
|---|---|---|---|
| 10,475,179 B1 * | 11/2019 | Bishop | G01R 31/308 |
| 10,866,664 B2 * | 12/2020 | Miyamoto | G06F 3/0443 |
| 10,871,866 B2 * | 12/2020 | Kang | G06F 3/0446 |
| 11,600,669 B2 * | 3/2023 | Na | G06F 3/0446 |
| 11,782,542 B2 * | 10/2023 | Miyamoto | G09G 3/3225 345/173 |

(Continued)

*Primary Examiner* — Patrick F Marinelli
(74) *Attorney, Agent, or Firm* — KDW Firm PLLC

(57) ABSTRACT

Provided are a display panel and a display device. The display panel includes a metal layer and a display function layer, and the metal layer is located between the display function layer and a display surface of the display panel; the metal layer includes multiple metal conductive structures, and the multiple metal conductive structures are arranged with a period, and are arranged in a first direction with a first period; the display function layer includes multiple pixel units, and the multiple pixel units are arranged with a period, and are arranged in a second direction with a second period; the first period and the second period are in a relationship of an integral multiple.

19 Claims, 12 Drawing Sheets

(56) References Cited

U.S. PATENT DOCUMENTS

| | | | | |
|---|---|---|---|---|
| 2015/0346866 A1* | 12/2015 | Kusunoki | ............ | G06F 3/0488 345/174 |
| 2016/0062409 A1* | 3/2016 | Guard | ................... | G06F 3/0412 349/12 |
| 2016/0092004 A1* | 3/2016 | Yoshiki | ................... | G06F 3/047 345/174 |
| 2016/0282989 A1* | 9/2016 | Hirakata | ............... | G06F 3/0446 |
| 2021/0358963 A1* | 11/2021 | Wu | ....................... | G06F 1/1637 |

* cited by examiner

DISPLAY PANEL AND DISPLAY DEVICE

CROSS-REFERENCE TO RELATED APPLICATION

This application claims priority to Chinese Patent Application No. 202110181905.3 filed Feb. 9, 2021, the disclosure of which is incorporated herein by reference in its entirety.

TECHNICAL FIELD

The present disclosure relates to display technologies and, in particular, to a display panel and a display device.

BACKGROUND

With the rapid development of display technologies, people have higher and higher requirements for the performance and appearance of a display device. For example, a full screen with a very high screen-to-body ratio almost occupies a large proportion in the consumer product market. Consumers prefer a lighter and thinner display device among devices with the same performance. Therefore, further reducing the thickness of the display device is always a popular development direction of the current display screen.

At present, when the display screen is manufactured, some metal film layers are usually bonded to a pixel layer, then the metal film layers can perform corresponding functions, and at the same time, the stacking of the film layers in the screen can be reduced and the lightness and thinness can be achieved. For example, in a touch display, the outside of a touch layer is bonded to the pixel layer; or an in-screen antenna is provided in the display area and the outside of the in-screen antenna is bonded to the pixel layer.

Most of the metal film layers bonded to the pixel layer include a periodic structure, and the periodic structure is at least partially located in a display area of the display screen. Therefore, a pixel opening area in the pixel layer is easily blocked by the metal film layers, leading to moiré fringes, which affects the display effect of the device.

SUMMARY

The present disclosure provides a display panel and a display device so that improvements on the problem of moiré fringes in the display panel can be achieved.

The present disclosure provides a display panel. The display panel includes a metal layer and a display function layer, and the metal layer is located between the display function layer and a display surface of the display panel.

The metal layer includes multiple metal conductive structures, and the multiple metal conductive structures are arranged with a period, and are arranged in a first direction with a first period.

The display function layer includes multiple pixel units, and the multiple pixel units are arranged with a period, and are arranged in a second direction with a second period.

The first period and the second period are in a relationship of an integral multiple.

Based on the same inventive concept, embodiments of the present disclosure further provide a display device. The display device includes the preceding display panel.

BRIEF DESCRIPTION OF DRAWINGS

In order that technical solutions in embodiments of the present disclosure or the related art are described more clearly, drawings to be used in the description of the embodiments or the related art are briefly described hereinafter. Apparently, while the drawings in the description are some embodiments of the present disclosure, for those skilled in the art, these drawings may be expanded and extended to other structures and drawings according to the basic concepts of the device structure, driving method and manufacturing method disclosed and indicated in embodiments of the present disclosure. These are undoubtedly all within the scope of the claims of the present disclosure.

DETAILED DESCRIPTION

In order that the objects, technical solutions and advantages of the present disclosure are clearer, the technical solutions of the present disclosure are described more clearly and completely hereinafter with reference to drawings of embodiments of the present disclosure and in conjunction with implementations. Apparently, the embodiments described herein are some embodiments, not all embodiments, of the present disclosure. All other embodiments obtained by those skilled in the art based on the basic concepts disclosed and indicated in embodiments of the present disclosure are within the scope of the present disclosure.

Figure 1:
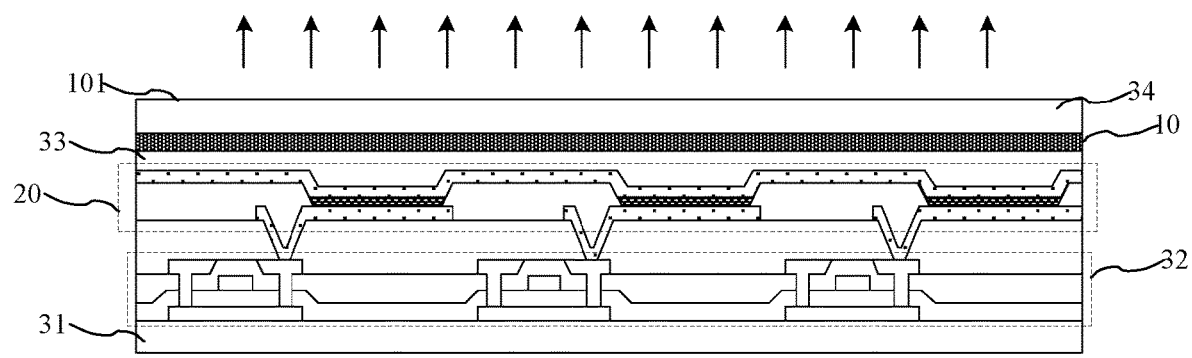
FIG. 1 is a schematic diagram of a display panel according to an embodiment of the present disclosure.
Figure 2:
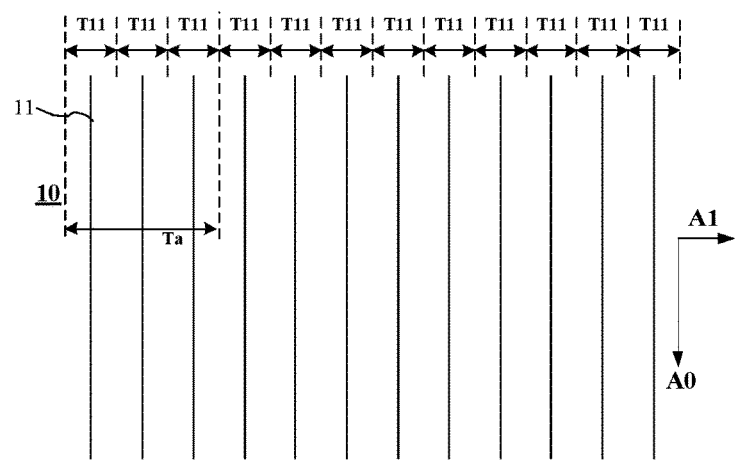
FIG. 2 is a top diagram of a metal layer of the display panel shown in FIG. 1.
Figure 5:
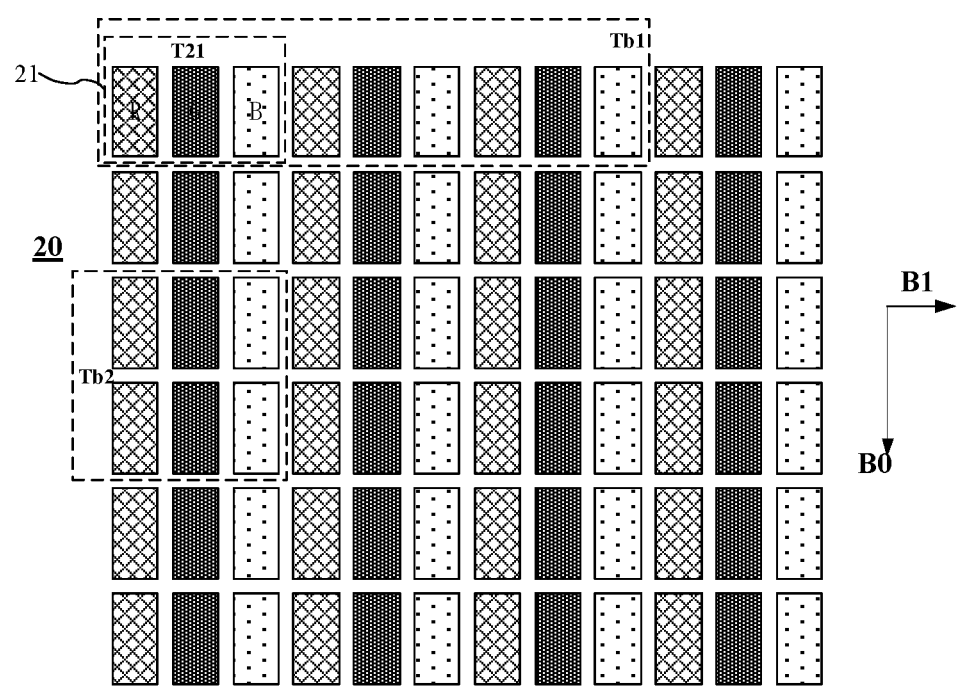
FIG. 5 is a top diagram of a display function layer of the display panel shown in FIG. 1.

Referring to FIG. 1, FIG. 1 is a schematic diagram of a display panel according to an embodiment of the present disclosure, FIG. 2 is a schematic diagram of a metal layer, and FIG. 5 is a schematic diagram of a display function layer. The display panel provided in embodiments of the present disclosure includes a metal layer 10 and a display function layer 20, and the metal layer 10 is located between the display function layer 20 and a display surface 101 of the display panel; the metal layer 10 includes multiple metal conductive structures 11, and the multiple metal conductive structures 11 are arranged with a period, and are arranged in a first direction with a first period; the display function layer 20 includes multiple pixel units 21, and the multiple pixel units 21 are arranged with a period, and are arranged in a second direction X2 with a second period; and the first period and the second period are in a relationship of an integral multiple.

In this embodiment, the metal layer 10 includes multiple metal conductive structures 11. Each metal conductive structure 11 may be a metal wire. In this embodiment, the case where each metal conductive structure 11 is a metal wire is used as an example for description. The metal layer 10 may be an in-screen antenna structure.

In other embodiments, the display panel may further include a substrate 31, an array layer 32, a display function layer 20, and a metal layer 10 that are stacked sequentially. The substrate 31 is a flexible substrate or a rigid substrate. The array layer 32 includes an array metal layer and an interlayer insulating layer, and the array layer 32 includes a pixel drive circuit array that drives the display function layer 20. The display function layer 20 includes multiple display units, the multiple display units include one or more colors, each display unit of the display function layer 20 is electrically connected to a respective one pixel drive circuit of the array layer 32, and the pixel drive circuit drives the display unit to display. The metal layer 10 may be a touch electrode layer or an in-screen antenna. An encapsulation layer 33 may be provided between the display function layer 20 and the metal layer 10, and a cover plate 34 is provided on one side of the metal layer 10 facing away from the display function layer 20; alternatively, an encapsulation layer may be located on one side of the metal layer 10 facing away from the display function layer 20; the encapsulation layer 33 may be a thin-film encapsulation layer.

The metal layer may include a metal grid, the metal grid includes multiple meshes, and each of the multiple metal conductive structures is a mesh. The metal layer may be a touch electrode layer; or the metal layer may be an antenna layer, and it is to be understood that the metal layer may also be another periodic metal function layer and is not limited to this.

The multiple metal conductive structures 11 in the metal layer 10 are arranged periodically in the first direction with the first period. Here, metal wires 11 are physical structures in the display panel and are arranged periodically. A gap exists between adjacent metal wires 11, and a period may be understood as including a structure formed by a metal wire 11 and a gap between the metal wires. The period of the metal wires 11 will be described in detail below.

A gap between two adjacent metal wires 11 in the metal layer 10 may be less than or equal to 400 μm 400 μm is less than the resolution of the human eye, and then a pattern of the metal layer 10 cannot be observed by the human eye.

FIG. 2 is a top diagram of a metal layer of the display panel shown in FIG. 1. As shown in FIG. 2, multiple metal wires 11 in the metal layer 10 are arranged with a period T11, that is, the metal layer 10 is formed by the periods T11 arranged continuously. One metal wire 11 is included in the period T11. The metal wires 11 extend in an A0 direction and are arranged in an A1 direction, A0 is perpendicular to A1, and then the periods T11 are arranged continuously in the A1 direction. In an exemplary embodiment, the first direction is the A1 direction, and the first period includes one period T11, that is, the first period is the period T11; alternatively, in an exemplary embodiment, the first direction is the A1 direction, the first period Ta includes i periods T11, for example, i=3, that is, the first period Ta is formed by three consecutive periods T11, and the metal layer 10 is formed by the first periods Ta arranged continuously in the A1 direction. In other embodiments, the period T11 may include multiple metal wires; and the first direction may be different from the A1 direction, and then the first period is different from the period T11.

Figure 3:
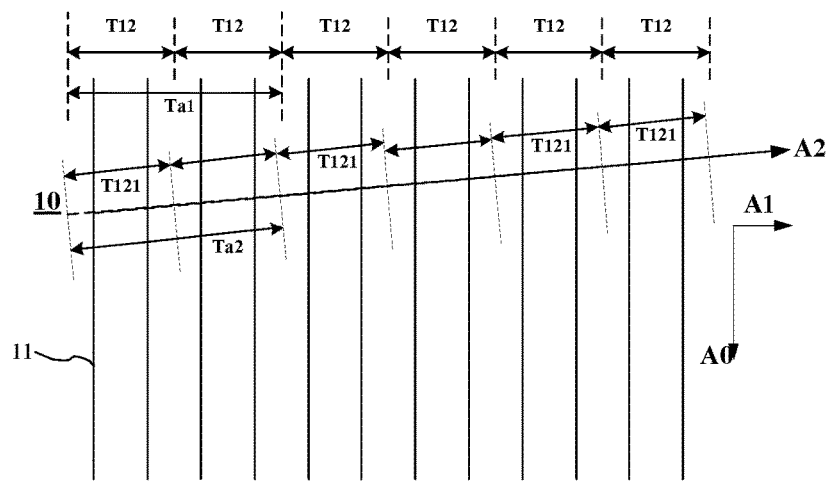
FIG. 3 is a top diagram of another metal layer of the display panel shown in FIG. 1.

FIG. 3 is a top diagram of another metal layer of the display panel shown in FIG. 1. As shown in FIG. 3, multiple metal wires 11 in the metal layer 10 are arranged with a period T12, that is, the metal layer 10 is formed by the periods T12 arranged continuously. j metal wires 11 may be included in the period T12, where j is a positive integer greater than 1. The metal wires 11 extend in the A0 direction and are arranged periodically in the A1 direction, and the periods T12 are arranged continuously in the A1 direction. In an exemplary embodiment, the first direction is the A1 direction, and the first period Ta1 includes i periods T12, where i is a positive integer. For example, if i=1, then the first period is the period T12; and if i=2, then the first period Ta1 is two consecutive periods T12, and the metal layer 10 is formed by the first periods Ta1 arranged continuously in the A1 direction. Alternatively, in an exemplary embodiment the first direction is an A2 direction different from the A1 direction, and the period T12 has a component T121 in the A2 direction. Apparently, periods T121 are arranged continuously in the A2 direction, and the first period Ta2 includes i periods T121, for example, if i=1, then the first period is the period T121; and if i=2, then the first period Ta2 is two consecutive periods T121, and the first periods Ta2 are arranged continuously in the A2 direction. It is to be understood that in the case where the period T12 changes, the component of the period T12 in the first direction changes, and the first period also changes.

Figure 4:
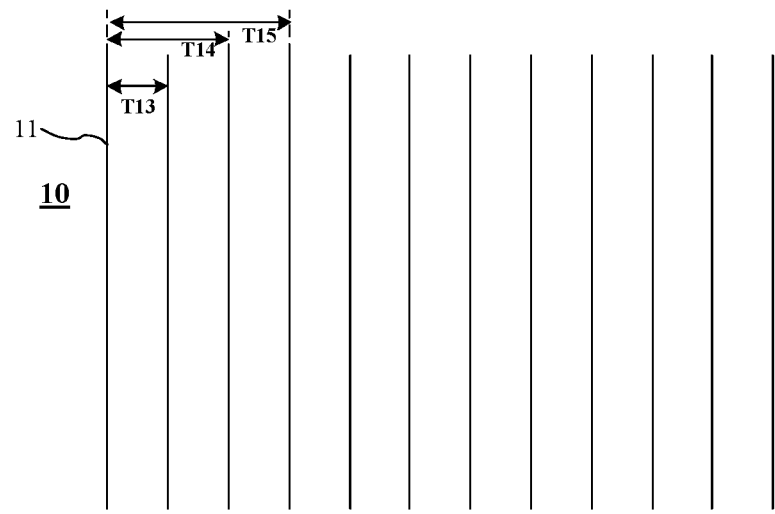
FIG. 4 is a top diagram of another metal layer of the display panel shown in FIG. 1.

FIG. 4 is a top diagram of another metal layer of the display panel shown in FIG. 1. As shown in FIG. 4, multiple metal wires 11 in the metal layer 10 are arranged with a period T13, or multiple metal wires 11 in the metal layer 10 are arranged with a period T14, or multiple metal wires 11 in the metal layer 10 are arranged with a period T15 or in other arrangements. In the case where the first direction changes and the periodic arrangement of the metal wires 11 changes, the first period also changes correspondingly.

The gap between two adjacent metal wires 11 in the metal layer 10 may be less than or equal to 400 µm. 400 µm is less than the resolution of the human eye, then the pattern of the metal layer 10 cannot be observed by the human eye.

It is to be noted that the metal layers shown in FIGS. 2 to 4 are only part of examples, which is not limited in the present disclosure. The metal layer only needs to satisfy the following conditions: the metal layer includes multiple metal conductive structures, and the multiple metal conductive structures are arranged with the period, and are arranged in the first direction with the first period. Further, the multiple metal wires 11 in the metal layer 10 extend in the A0 direction and are arranged periodically in the A1 direction, so the components of the metal wires 11 in the first direction are also regarded as being arranged periodically, and the multiple metal wires 11 are arranged in the first direction with the first period. The first direction should intersect the A0 direction, for example, the first direction is the A1 direction, or the first direction is the A2 direction, or the first direction is another direction that intersects A0.

In this embodiment, the display function layer 20 includes multiple pixel units 21. Each of the multiple pixel units 21 includes one or more sub-pixels. In this embodiment, the case where each of the multiple pixel units 21 includes three sub-pixels of different colors is used as an example for description.

The multiple pixel units 21 in the display function layer 20 are arranged with the period, and are arranged in the second direction with the second period. Here, the multiple pixel units 21 are physical structures in the display panel and are arranged periodically. The period of the multiple pixel units 21 will be described in detail below.

FIG. 5 is a top diagram of a display function layer of the display panel shown in FIG. 1. As shown in FIG. 5, the display function layer 20 includes multiple identical pixel units 21, and each of the multiple pixel units 21 includes three sub-pixels of different colors arranged in a fixed order. For example, the color arrangement order of the three sub-pixels in each of the multiple pixel units 21 is red R, green G, and blue B. The display function layer 20 is formed by the multiple identical pixel units 21 arranged in an array. Each pixel unit 21 may form one period T21, and the display function layer 20 is formed by the periods T21 arranged in an array. A column of pixel units 21 are arranged periodically in a B0 direction, and a row of pixel units 21 are arranged periodically in a B1 direction, where B0 is perpendicular to B1. In an exemplary embodiment, the second direction is the B1 direction, and the second period Tb1 includes i periods T21, for example, if i=1, then the second period is the period T21; if i=3, then the second period Tb1 is formed by three consecutive periods T21 in the B1 direction. Alternatively, in an exemplary embodiment the second direction is the B0 direction, and the second period Tb2 includes i periods T21, for example, if i=1, then the second period is the period T21; if i=2, then the second period Tb2 is formed by two consecutive periods T21 in the B0 direction. In other embodiments, multiple pixel units may be included in the period T21; and the second direction may be different from the B0 direction and the B1 direction.

Figure 6:
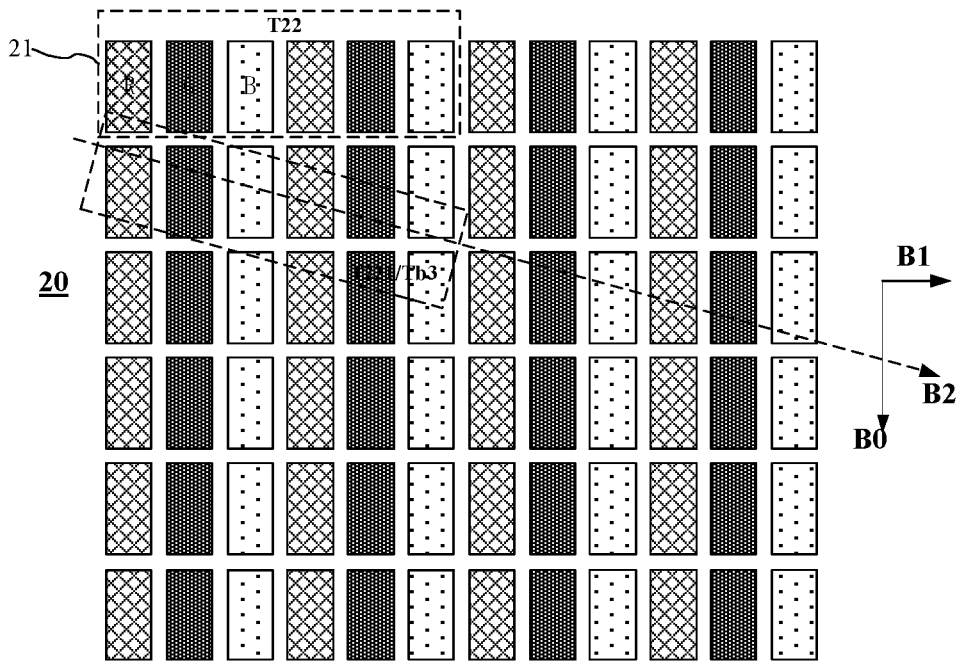
FIG. 6 is a top diagram of another display function layer of the display panel shown in FIG. 1.

FIG. 6 is a top diagram of another display function layer of the display panel shown in FIG. 1. As shown in FIG. 6, in an exemplary embodiment, two consecutive pixel units 21 in the B1 direction form one period T22, and the display function layer 20 is formed by the periods T22 arranged in an array. In an exemplary embodiment, the second direction is a B2 direction which intersects the B0 direction and the B1 direction separately, and the period T22 has a component T221 in the B2 direction. Apparently, periods T221 are arranged continuously in the B2 direction, and the second period Tb3 includes i periods T221, for example, if i=1, then the second period Tb3 is the period T221; if i=2, then the second period is two consecutive periods T221, and the second periods are arranged continuously in the B2 direction. It is to be understood that in the case where the period T22 changes, the component of the period T22 in the second direction changes, and the second period also changes. It is to be understood that the pixel units 21 are arranged periodically in the B1 direction and the B0 direction to form an array. Therefore, the pixel units 21 are also regarded as being arranged periodically in the direction intersecting the B1 direction, and the pixel units 21 are also regarded as being arranged periodically in the direction intersecting the B0 direction.

Figure 7:
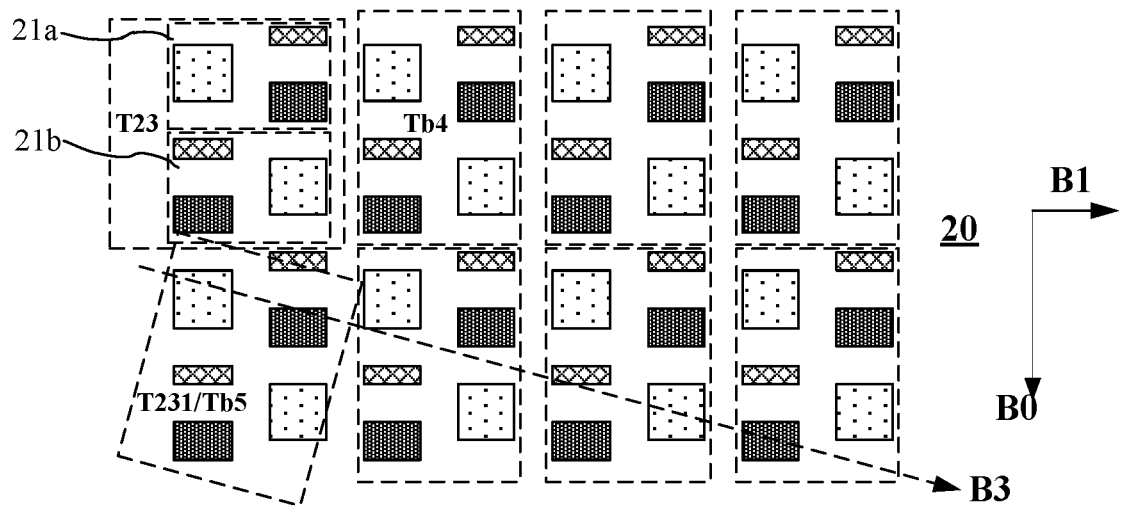
FIG. 7 is a top diagram of another display function layer of the display panel shown in FIG. 1.

FIG. 7 is a top diagram of another display function layer of the display panel shown in FIG. 1. As shown in FIG. 7, the display function layer 20 includes multiple first pixel units 21a and multiple second pixel units 21b, and each pixel unit includes three sub-pixels of different colors. In the B0 direction, the multiple first pixel units 21a and the multiple second pixel units 21b are arranged at intervals. In the B1 direction, multiple identical pixel units are included in one row, for example, an odd-numbered row includes multiple first pixel units 21a arranged periodically, and an even-numbered row includes multiple second pixel units 21b arranged periodically. The display function layer 20 is formed by periods T23 arranged in an array, and the periods T23 may be arranged in an array in the B0 direction and the B1 direction.

In an exemplary embodiment, the second direction is the B0 direction, and the second period Tb4 includes i periods T23, for example, if i=1, then the second period Tb4 is the period T23; if i=2, then the second period is formed by two consecutive periods T23 in the B0 direction. The second direction is the B1 direction, and the second period includes i periods T23, for example, if i=1, then the second period is the period T23; if i=2, then the second period is formed by two consecutive second period T23 in the B1 direction. In an exemplary embodiment, the second direction is a B3 direction, the B3 direction intersects the B0 direction and the B1 direction separately, and the period T23 has a component T231 in the B3 direction. Apparently, periods T231 are arranged continuously in the B3 direction, and the second period Tb5 includes i periods T231, for example, if i=1, then the second period Tb5 is the period T231; if i=2, then the second period is formed by two consecutive periods T231.

It is to be understood that in the case where the period T23 changes, the component of the period T23 in the second direction changes, and the second period also changes. It is to be understood that the periods T23 are arranged in an array in the B0 direction and the B1 direction. Therefore, the periods T23 is also regarded as being arranged periodically in the direction intersecting the B1 direction, and the periods T23 is also regarded as being arranged periodically in the direction intersecting the B0 direction. It is to be noted that the display function layers shown in FIGS. 5 to 7 are only part of examples, which is not limited in the present disclosure. The display function layer only needs to satisfy the following conditions: multiple pixel units in the display function layer are arranged with the period, and are arranged in the second direction with the second period.

It is to be understood that the first period and the second period are both physical structures. The first period includes at least one metal conductive structure, and the metal layer is formed by the first periods arranged continuously; the second period includes at least one pixel unit, and the display function layer is formed by the second periods arranged continuously. Therefore, the first period has a dimension parameter in the first direction, and the second period has a dimension parameter in the second direction. In this embodiment, the first period and the second period are in a relationship of an integral multiple. Specifically, the ratio of the dimension of the first period in the first direction to the dimension of the second period in the second direction is an integral multiple; or the ratio of the dimension of the second period in the second direction to the dimension of the first period in the first direction is an integral multiple.

In conjunction with FIGS. 2 and 5, if the first period is T11 and the second period is T21, the dimension of the first period T11 in the A1 direction and the dimension of the second period T21 in the B1 direction are in a relationship of an integral multiple.

In conjunction with FIGS. 2 and 6, if the first period is T11 and the second period is T221, the dimension of the first period T11 in the A1 direction and the dimension of the second period T221 in the B2 direction are in a relationship of an integral multiple.

In conjunction with FIGS. 2 and 7, if the first period is T11, the second period is T23, and the second direction is the B0 direction, then the dimension of the first period T11 in the A1 direction and the dimension of the second period T23 in the B0 direction are in a relationship of an integral multiple.

In conjunction with FIGS. 3 and 6, if the first period is T121, the second direction is B2, and the second period is T221, then the dimension of the first period T121 in the A2 direction and the dimension of the second period T221 in the B2 direction are in a relationship of an integral multiple.

In conjunction with FIGS. 3 and 7, if the first period is T121, the second direction is B1, and the second period is T23, then the dimension of the first period T121 in the A2 direction and the dimension of the second period T23 in the B1 direction are in a relationship of an integral multiple; or if the first period is T121, the second direction is B0, and the second period is T23, the dimension of the first period T121 in the A2 direction and the dimension of the second period T23 in the B0 direction are in a relationship of an integral multiple; or if the first period is T121, the second direction is B3, and the second period is T231, then the dimension of the first period T121 in the A2 direction and the dimension of the second period T231 in the B3 direction are in a relationship of an integral multiple.

As shown in FIG. 1, the metal layer 10 is located between the display function layer 20 and the display surface 101 of the display panel, and the first period and the second period are in a relationship of an integral multiple, then the metal layer 10 and the display function layer 20 are bonded together so that moiré fringes can be reduced.

The following will explain the technical principle of "the first period and the second period are in a relationship of an integral multiple so that the moiré fringes can be reduced" through the generation principle of the moiré fringes.

Moiré fringes are similar to interference in physics. If there are two patterns 1 and 2 that both have the periodicity and the periods of the two are relatively close, then the bonding of the two generates the moiré fringes. Specifically, the pattern 1 has a period 1, the pattern 2 has a period 2, and the period 1 is close to the period 2. In the case where the least common multiple of the period 1 and the period 2 is different from the two periods, the bonded pattern 1 and the pattern 2 will generate a pattern with a greater period. The pattern with a greater period is defined as a pattern 3 with a period 3. The period 3 of the pattern 3 is the least common multiple of the period of the pattern 1 and the period of the pattern 2, and the period 3 is different from the period 1 and the period 2.

Assuming that under normal circumstances, the periodic pattern of the pattern 1 is less than the resolution of the human eye, and the periodic pattern of the pattern 2 is less than the resolution of the human eye, then both the pattern 1 and the pattern 2 cannot be observed by the human eye. However, in the case where the pattern 1 and the pattern 2 are bonded to generate the pattern 3 with a greater period, since the period 3 of the pattern 3 is the least common multiple of the period 1 of the pattern 1 and the period 2 of the pattern 2, the period of the pattern 3 is so large that the periodic pattern of the pattern 3 is likely to be observed by the human eye. In this manner, the pattern 3, which is visible to the human eye and should not exist, appears in the picture after the pattern 1 and the pattern 2 are bonded, and the pattern 3 is the moiré fringes.

Based on this, for the pattern 1 and the pattern 2, the period 1 and the period 2 are configured to be in a relationship of an integral multiple, that is, the least common multiple of the period 1 and the period 2 is the same as one of the two periods, for example, the least common multiple of the period 1 and the period 2 is the period 1. In this manner, after the pattern 1 and the pattern 2 are bonded together, a pattern 3' is generated. The period 3 of the pattern 3' is the least common multiple of the period 1 and the period 2, that is, the period 3 of the pattern 3' is equal to the period 1. Alternatively, the least common multiple of the period 1 and the period 2 is the period 2, and thus the period 3 of the pattern 3' is equal to the period 2.

It is known that the periodic pattern of the pattern 1 is less than the resolution of the human eye, and the periodic pattern of the pattern 2 is less than the resolution of the human eye, since the period 3 of the pattern 3' is equal to the period 1 or the period 2, the periodic pattern of the pattern 3' generated by the bonding of the pattern 1 and the pattern 2 is also less than the resolution of the human eye. Therefore, like the pattern 1 and the pattern 2, the periodic pattern of the pattern 3' cannot be observed by the human eye. Therefore, the pattern 3' visible to the human eye does not appear in the picture after the pattern 1 and the pattern 2 are bonded, so that the moiré fringes can be reduced.

With reference to the preceding analysis, in an exemplary embodiment, the pattern 1 is the metal layer 10, the pattern 2 is the display function layer 20, the metal layer 10 is provided with the metal conductive structures arranged with the first period, and the display function layer 20 is provided with the pixel units arranged with the second period, and the metal layer 10 and the display function layer 20 are stacked. The first period of the metal layer 10 and the second period of the display function layer 20 are configured to be in a relationship of an integral multiple so that a period a of a pattern A generated after the metal layer 10 and the display function layer 20 are bonded is equal to the first period or the second period. It is known that the first period and the second period are both less than the resolution of the human eye so that a periodic pattern of the pattern A generated after the metal layer 10 and the display function layer 20 are bonded is also less than the resolution of the human eye. Therefore, the pattern A visible to the human eye does not appear in the picture after the metal layer 10 and the display function layer 20 are bonded, and the moiré fringes in the picture after the metal layer 10 and the display function layer 20 are bonded are reduced.

In embodiments of the present disclosure, the metal layer is located between the display function layer and the display surface of the display panel; multiple metal conductive structures of the metal layer are arranged with the period, and are arranged in the first direction with the first period; multiple pixel units of the display function layer are arranged periodically in the second direction with the second period. The first period and the second period are in a relationship of an integral multiple so that a period of a new pattern generated after the metal layer and the display function layer are bonded is equal to the first period or the second period. The first period and the second period are both less than the resolution of the human eye so that a periodic pattern of the new pattern generated after the metal layer and the display function layer are bonded is also less than the resolution of the human eye. Therefore, no new pattern visible to the human eye appears in a picture after the metal layer and the display function layer are bonded, thereby reducing moiré fringes in the picture after the metal layer and the display function layer are bonded, reducing the process requirements of bonding accuracy for the metal layer and the display function layer, and improving the display effect of the panel. In the display panel provided in embodiments of the present disclosure, the display function layer and the metal layer are mutually utilized so that the following positive influences are formed: the moiré fringes are eliminated, and the cost are reduced while function superposition is achieved.

Figure 8:
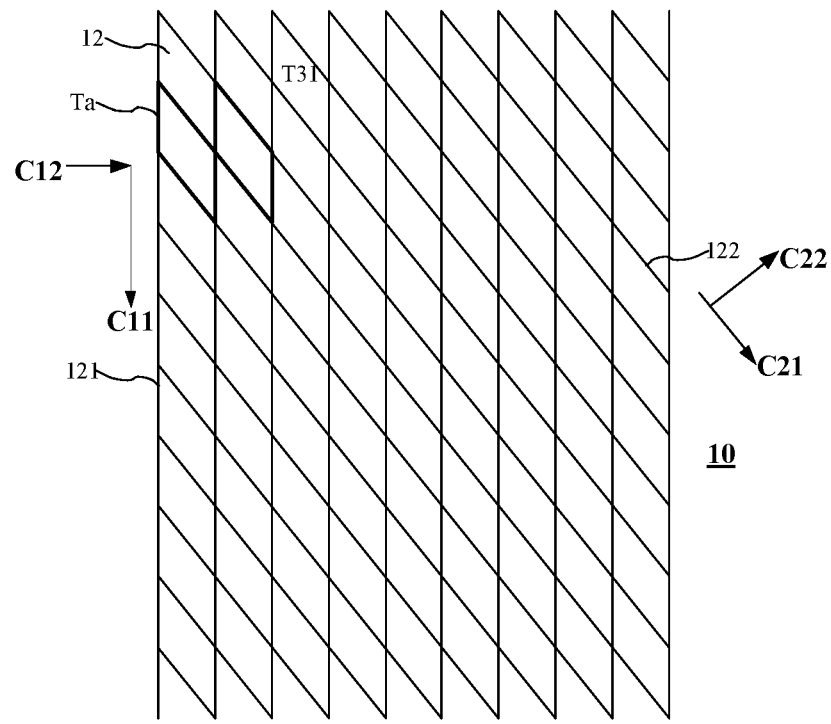
FIG. 8 is a top diagram of another metal layer of the display panel shown in FIG. 1.
Figure 9:
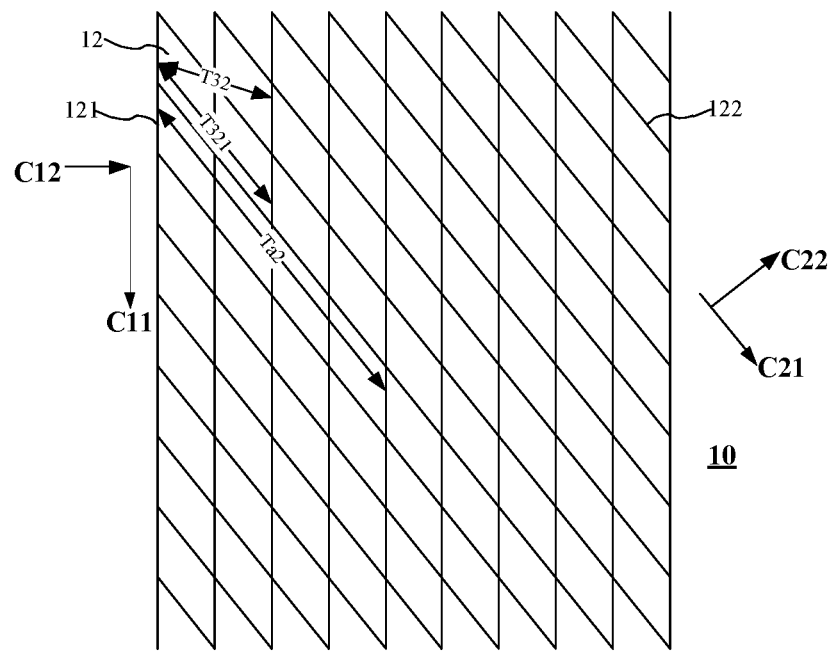
FIG. 9 is a top diagram of another metal layer of the display panel shown in FIG. 1.

By way of example, the metal layer includes a metal grid, the metal grid includes multiple meshes, and each of the multiple metal conductive structures is a mesh. FIG. 8 is a top diagram of another metal layer of the display panel shown in FIG. 1, and FIG. 9 is a top diagram of another metal layer of the display panel shown in FIG. 1. As shown in FIGS. 8 and 9, the metal layer 10 includes multiple metal conductive structures 12, and the multiple metal conductive structures 12 are the meshes. In this embodiment, the case where the multiple metal conductive structures 12 are meshes is used as an example for description. The metal layer may be a touch electrode layer; or the metal layer may be an antenna layer, and it is also feasible that the metal layer is another periodic metal function layer and is not limited to this.

The metal layer 10 includes multiple first metal wires 121 extending in a C11 direction and arranged in a C12 direction. The multiple first metal wires 121 are arranged periodically in the C12 direction, and a gap exists between two adjacent first metal wires 121. The metal layer 10 further includes multiple second metal wires 122 extending in a C21 direction and arranged in a C22 direction. The multiple second metal wires 122 are arranged periodically in the C22 direction, and a gap exists between two adjacent second metal wires 122. In the metal layer 10, the multiple first metal wires 121 and the multiple second metal wires 122 intersect to form multiple meshes 12, so each of the multiple meshes 12 is a quadrilateral area surrounded by line segments of two adjacent first metal wires 121 and line segments of two adjacent second metal wires 122 connected end to end. The quadrilateral area is a hollow area surrounded by the four metal line segments connected end to end, and the hollow area does not include metal materials. The contour of each of the multiple meshes may be formed by the preceding metal wires.

In an exemplary embodiment, the gap between two adjacent first metal wires 121 in the metal layer 10 is less than or equal to 400 μm, and the gap between two adjacent second metal wires 122 in the metal layer 10 is less than or equal to 400 μm. 400 μm is less than the resolution of the human eye, and thus the dimension of each of the multiple meshes 12 defined by the intersection of the multiple first metal wires 121 arranged periodically and the multiple second metal wires 122 arranged periodically is less than the resolution of the human eye, and the pattern of the metal layer 10 cannot be observed by the human eye.

The dimension of one mesh 12 may be the distance between two adjacent first metal wires 121 forming the mesh 12 and/or the distance between two adjacent second metal wires 122 forming the mesh 12. The multiple meshes 12 in the metal layer 10 are arranged with the period, and are arranged in the first direction with the first period. Each of the multiple meshes 12 is a quadrilateral hollow area surrounded by metal line segments and the multiple meshes 12 are arranged periodically. A period may be understood as a solid hollow structure formed by one mesh or a period may be understood as a solid hollow structure formed by the splicing of multiple adjacent meshes 12. The period of the meshes 12 will be described in detail below.

As shown in FIG. 8, multiple meshes 12 in the metal layer 10 are arranged with a period T31. The metal layer 10 is formed by periods T31 arranged continuously in the C12 direction and periods T31 arranged continuously in the C11 direction. The period T31 may be one mesh 12. In an exemplary embodiment, the first direction is the C12 direction, and the first period includes one period T31, that is, the first period is the period T31; alternatively, in an exemplary embodiment, the first direction is the C12 direction, the first period Ta includes i periods T31, for example, i=2, that is, the first period Ta is formed by two consecutive periods T31 in the C12 direction, and the metal layer 10 is formed by first periods Ta arranged continuously in the C12 direction and first periods Ta arranged continuously in the C11 direction. It is to be understood that the multiple meshes 12 in the metal layer 10 are also arranged periodically in the C11 direction.

As shown in FIG. 9, multiple meshes 12 in the metal layer 10 are arranged with a period T32. The metal layer 10 is formed by periods T32 arranged continuously in the C12 direction and periods T32 arranged continuously in the C11 direction. The period T32 may be formed by j meshes 12, where j is greater than 1. For example, as shown in FIG. 9, j=2. In an exemplary embodiment, the first direction is the C21 direction, and the period T32 has a component T321 in the C21 direction. Apparently, periods T321 are arranged continuously in the C21 direction, and the first period Ta2 includes i periods T321, for example, if i=1, then the first period is the period T321; if i=2, then the first period Ta2 is two consecutive periods T321, and first periods Ta2 are arranged continuously in the C21 direction.

In other embodiments, multiple meshes in the metal layer may be arranged with a period Tx, and the period Tx may be formed by n×m adjacent meshes. The first direction may also be different from C11, C12, C21, and C22 so that the first period is different from the period T321.

It is to be noted that the metal layers shown in FIGS. 8 to 9 are only part of examples, which is not limited in the present disclosure. The metal layer only needs to satisfy the following condition: the metal layer includes a metal grid, the metal grid includes multiple meshes, the metal conductive structures are meshes, and multiple metal conductive structures are arranged with the period, and are arranged in the first direction with the first period. Further, if the meshes in the metal layer are arranged periodically, the components of the meshes in the first direction are also regarded as being arranged periodically.

By way of example, based on the preceding technical solution, multiple metal conductive structures may include first minimum repeating units, and one first minimum repeating unit forms one period; the first period includes one or more first minimum repeating units. Multiple metal conductive structures in the metal layer include first minimum repeating units, the first minimum repeating unit serves as one period, the metal layer is formed by the first minimum repeating units arranged repeatedly, and no repeating structure exists in the first minimum repeating unit.

Referring to FIG. 2, the shapes of the metal wires 11 in the metal layer 10 are exactly the same and are arranged with the period T11, that is, the metal layer 10 is formed by the metal wires 11 arranged repeatedly with a set interval, and the first minimum repeating unit in the metal layer 10 is the period T11 of one metal wire 11. No repeating structure is included in the first minimum repeating unit.

Referring to FIG. 8, the shapes of the meshes 12 in the metal layer 10 are exactly the same and are arranged with the period T31, that is, the metal layer 10 is formed by the meshes 12 arranged repeatedly, and the first minimum repeating unit in the metal layer 10 is one mesh 12, that is, the period T31. No repeating structure is included in the first minimum repeating unit.

Figure 10:
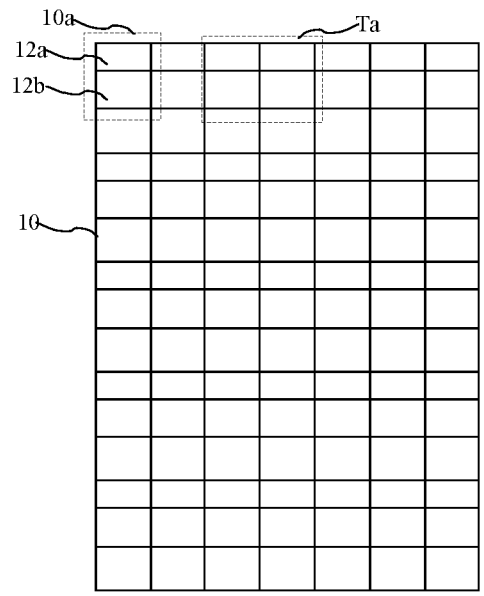
FIG. 10 is a top diagram of another metal layer of the display panel shown in FIG. 1.

In other embodiments, referring to FIG. 10, FIG. 10 is a top diagram of another metal layer of the display panel shown in FIG. 1. As shown in FIG. 10, the metal layer 10 may include multiple meshes. Two types of meshes 12a and 12b with different shapes exist in the multiple meshes. Two types of meshes 12a and 12b with different shapes form one repeating unit 10a. The repeating unit 10a includes only two meshes 12a and 12b with different shapes. The metal layer 10 is formed by repeating units 10a arranged repeatedly so that the first minimum repeating unit of the metal layer 10 is the repeating unit 10a.

Multiple metal conductive structures in the metal layer are arranged in the first direction with the first period, the metal layer is formed by the first periods arranged repeatedly, and the first period includes one or more first minimum repeating units. Referring to FIG. 2, the first period Ta may include three first minimum repeating units T11. Referring to FIG. 8, the first period Ta may include two first minimum repeating units T31. Referring to FIG. 10, the first period Ta may include two first minimum repeating units 10a. It is to be understood that when the first period is determined in the metal layer, it is necessary to ensure that the first period satisfies the following condition: the first period and the second period in the display panel are in a relationship of an integral multiple.

In an exemplary embodiment, the pixel unit includes multiple sub-pixels; the sub-pixels of the display function layer include second minimum repeating units, and each second minimum repeating unit forms one period; and the second period includes one or more second minimum repeating units.

The display function layer includes multiple sub-pixels, the multiple sub-pixels includes second minimum repeating units, and the second minimum repeating unit serves as one period. The display function layer is formed by second minimum repeating units arranged repeatedly. In an arrangement direction of the second minimum repeating units, no smaller repeating structure exists in the second minimum repeating unit. That is, no smaller repeating structure exists at least in the preceding arrangement direction.

Referring to FIG. 5, the shapes of the pixel units 21 in the display function layer 20 are exactly the same and are arranged with the period T21 and each pixel unit 21 includes three sub-pixels of different colors arranged in a fixed order so that the display function layer 20 is formed by pixel units 21 arranged periodically and repeatedly, each pixel unit 21 including three sub-pixels of different colors as a period, and the second minimum repeating unit of the display function layer 20 is one pixel unit 21.

Figure 11:
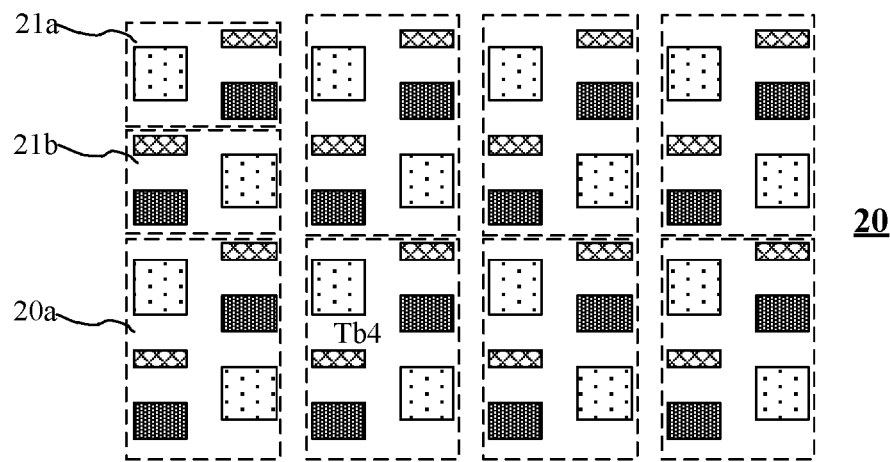
FIG. 11 is a top diagram of another display function layer of the display panel shown in FIG. 1.

In other embodiments, referring to FIG. 11, FIG. 11 is a top diagram of another display function layer of the display panel shown in FIG. 1. In an exemplary embodiment, as shown in FIG. 11, two different types of pixel units 21a and 21b exist in the display function layer 20, each of the pixel unit 21a and the pixel unit 21b includes three sub-pixels of different colors, and the sub-pixel arrangement order of the pixel unit 21a is different from the sub-pixel arrangement order of the pixel unit 21b. Specifically, in the display function layer 20, the pixel unit 21a and the pixel unit 21b form one group so that one repeating unit 20a is formed. The repeating unit 20a includes only two pixel units 21a and 21b with different shapes. The display function layer 20 is formed by repeating units 20a arranged repeatedly, and the second minimum repeating unit of the display function layer 20 is the repeating unit 20a.

Multiple pixel units in the display function layer are arranged in the second direction with the second period, the display function layer is formed by the second periods arranged repeatedly, and the second period includes one or more second minimum repeating units. Referring to FIG. 5, the second period Tb1 may include three second minimum repeating units 21. Referring to FIG. 11, the second period Tb4 may include one second minimum repeating unit 21. It is to be understood that when the second period is determined in the display function layer, it is necessary to ensure that the second period satisfies the following condition: the first period and the second period in the display panel are in a relationship of an integral multiple.

The metal layer and the display function layer are designed by using the preceding solutions, and the first period and the second period are in a relationship of an integral multiple so that the moiré fringes in the picture after the metal layer and the display function layer are bonded can be reduced.

By way of example, based on the preceding technical solutions, multiple metal conductive structures include first repeating units, and the first repeating units are arranged periodically; multiple pixel units include second repeating units, and the second repeating units are arranged periodically; the contour of the first repeating unit is the same as the contour of the second repeating unit. In an exemplary embodiment, the first repeating unit includes an array of m×n metal conductive structures; the pixel unit includes multiple sub-pixels, and the second repeating unit includes n columns of sub-pixels in the row direction and m rows of sub-pixels in the column direction.

Figure 12:
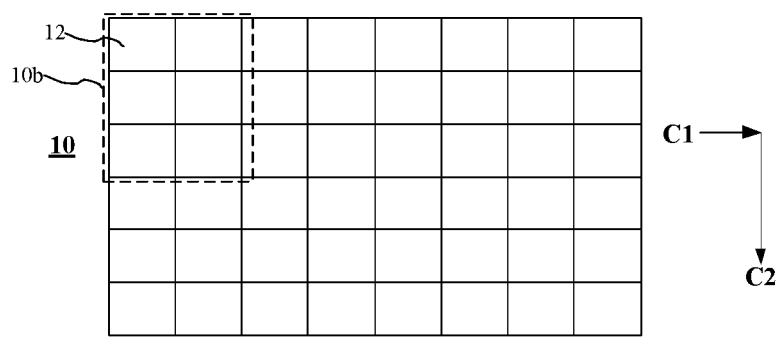
FIG. 12 is a top diagram of another metal layer of the display panel shown in FIG. 1.

Referring to FIG. 12, FIG. 12 is a top diagram of another metal layer of the display panel shown in FIG. 1. As shown in FIG. 12, the metal conductive structure 12 may be a mesh. Multiple metal conductive structures 12 includes first repeating units 10b, and the first repeating units 10b are arranged periodically. The metal layer 10 is formed by the first repeating units 10b arranged repeatedly, and the first repeating unit 10b includes one or more metal conductive structures 12. In this embodiment, the first repeating unit 10b includes 3×2 metal conductive structures 12, and the metal conductive structures 12 in the metal layer 10 are arranged periodically so that the outer contour of the first repeating unit 10b is rectangular. In an exemplary embodiment, the first repeating units 10b are arranged repeatedly in a C1 direction, and the first repeating units 10b are arranged repeatedly in a C2 direction so that the metal layer 10 is formed by the first repeating units 10b arranged in an array, the first direction of the array is parallel to the C1 direction, and the second direction of the array is parallel to the C2 direction.

Figure 13:
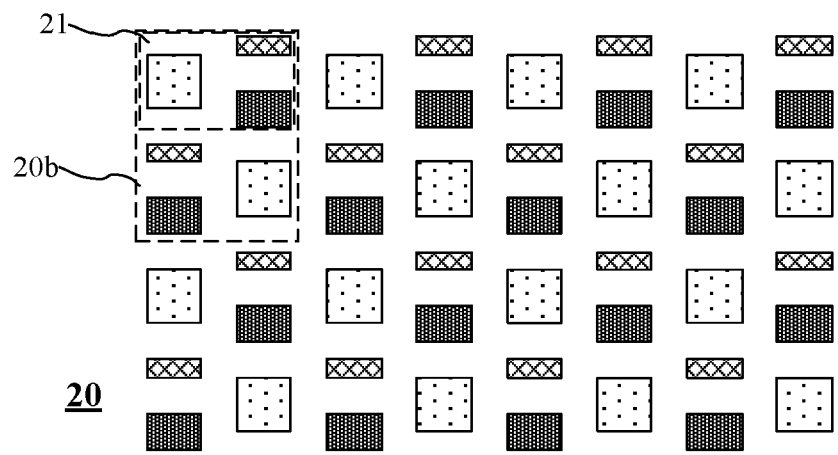
FIG. 13 is a top diagram of another display function layer of the display panel shown in FIG. 1.

Referring to FIG. 13, FIG. 13 is a top diagram of another display function layer of the display panel shown in FIG. 1. As shown in FIG. 13, multiple pixel units 21 include second repeating units 20b, and the second repeating units 20b are arranged periodically. The display function layer 20 is formed by the second repeating units 20b arranged repeatedly, and the second repeating unit 20b includes one or more pixel units 21. In this embodiment, if the second repeating unit 20b includes two columns of sub-pixels in the row direction and three rows of sub-pixels in the column direction, the outer contour of the second repeating unit 20b is rectangular. Specifically, a rectangle fitted according to the arrangement shape of the sub-pixels at the outermost edge of the second repeating unit 20b is the outer contour of the second repeating unit 20b, and the outer contour of the second repeating unit 20b surrounds all sub-pixels in the second repeating unit 20b. It is to be understood that if the arrangement of the sub-pixels in the second repeating unit changes, the shape of the outer contour of the second repeating unit may change.

Figure 14:
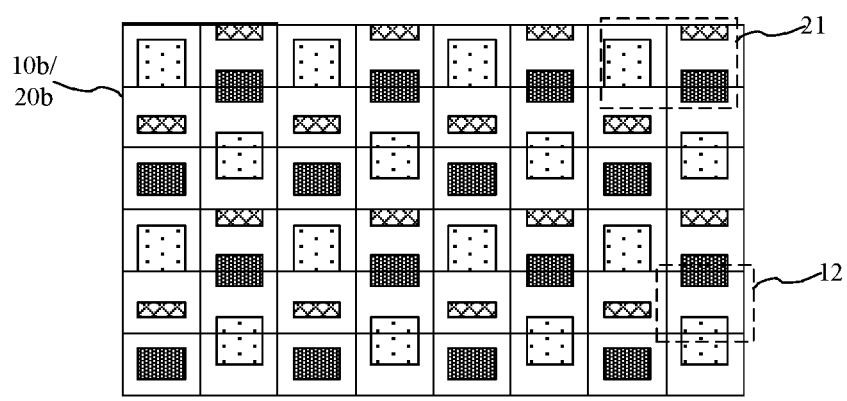
FIG. 14 is a schematic diagram of orthographic projections of the metal layer and the display function layer on the same plane.

Referring to FIG. 14, FIG. 14 is a schematic diagram of orthographic projections of the metal layer and the display function layer on the same plane. As shown in FIG. 14, the contour of the first repeating unit 10b is the same as the contour of the second repeating unit 20b, that is, the pattern surrounded by the outer contour of the first repeating unit 10b is the same as the pattern surrounded by the outer contour of the second repeating unit 20b. The same contours mentioned here mean that the shapes and areas of the two patterns are the same, that is, the pattern surrounded by the outer contour of the first repeating unit 10b can be obtained by translation of the pattern surrounded by the outer contour of the second repeating unit 20b without rotation. In this manner, in the case where the first period includes one or more first repeating units, and the second period includes one second repeating unit, then the first period is an integral multiple of the period of the second repeating units. Similarly, in the case where the second period includes one or multiple second repeating units, and the first period includes one first repeating unit, then the second period is an integral multiple of the period of the first repeating units.

For the metal layer and the display function layer manufactured by the preceding solutions, the first period and the second period may be in a relationship of an integral multiple. Based on this, no pattern visible to the human eye appears in the picture after the metal layer 10 and the display function layer 20 are bonded, and the moiré fringes in the picture after the metal layer 10 and the display function layer 20 are bonded are reduced.

It is to be noted that, in some embodiments, based on the condition that the first period of the metal wires in the metal layer and the second period of the pixel units in the display function layer are in a proportional relationship of an integral multiple, the interval between the metal wires may be greater than the pixel size. In this manner, after the metal layer and the display function layer are bonded, the metal wires and the pixels do not overlap so that the moiré fringes can be eliminated. If the metal wires overlap the pixels after the metal layer and the display function layer are bonded, since the first period of the metal wires in the metal layer and the second period of the pixel units in the display function layer are in a proportional relationship of an integral multiple, the moiré fringes do not appear in the display panel. Therefore, in embodiments of the present disclosure, the problem that the moiré fringes appear easily due to the bonding of the metal layer and the display function layer can be eliminated.

By way of example, based on the preceding technical solutions, the first direction may be the same as the second direction. The arrangement direction of the period of multiple metal conductive structures may be the same as the arrangement direction of the period of multiple pixel units.

Figure 15:
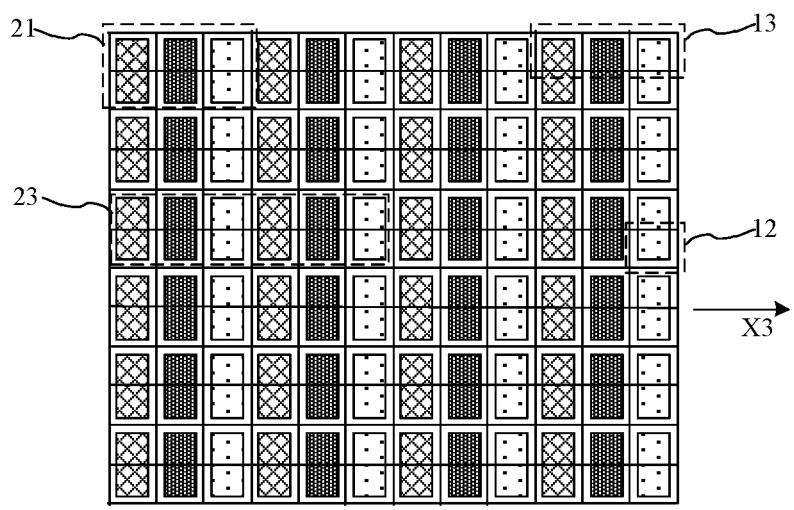
FIG. 15 is another schematic diagram of orthographic projections of the metal layer and the display function layer on the same plane.
Figure 16:
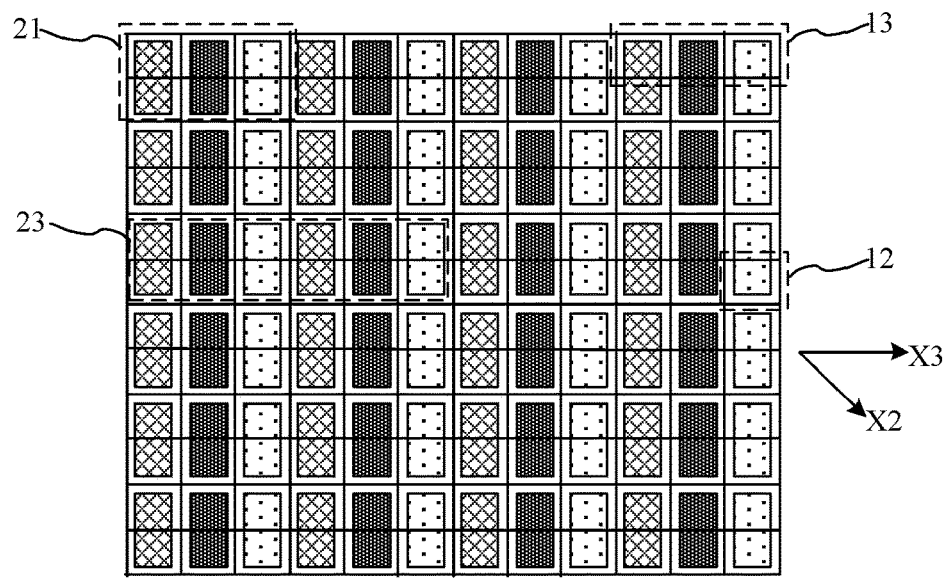
FIG. 16 is another schematic diagram of orthographic projections of the metal layer and the display function layer on the same plane.

Referring to FIG. 15, FIG. 15 is another schematic diagram of orthographic projections of the metal layer and the display function layer on the same plane. Referring to FIG. 16, FIG. 16 is another schematic diagram of orthographic projections of the metal layer and the display function layer on the same plane. As shown in FIG. 15, an exemplary embodiment, each metal conductive structure 12 is a mesh, multiple metal conductive structures 12 in the metal layer are arranged with a period 13, multiple pixel units 21 in the display function layer are arranged with a period 23, the arrangement direction of the period of the multiple metal conductive structures 12 is the same as the arrangement direction of the period of the multiple pixel units 21, and the arrangement direction of the period of the multiple metal conductive structures 12 and the arrangement direction of the period of the multiple pixel units 21 are both parallel to an X3 direction.

As shown in FIG. 15, a second direction is selected, and the first direction and the second direction are both parallel to the X3 direction. In this manner, in the X3 direction, the arrangement period 13 of the multiple metal conductive structures 12 is the first period, and the arrangement period 23 of the multiple pixel units 21 is the second period. The first period and the second period are configured to be in a relationship of an integral multiple so that no pattern visible to the human eye appears in the picture after the metal layer and the display function layer are bonded, and the moiré fringes in the picture after the metal layer and the display function layer are bonded can be reduced.

As shown in FIG. 16, a second direction is selected, the first direction is the same as the second direction, and the second direction X2 intersects the X3 direction. The metal conductive structures 12 are arranged in the X3 direction with the period 13 so that the components of arrangement periods 13 of the metal conductive structures 12 in the X2 direction are also arranged periodically; the pixel units 21 are arranged in the X3 direction with the period 23 so that the components of arrangement periods 23 of the pixel units 21 in the X2 direction are also arranged periodically. The first direction is the same as the second direction, multiple metal conductive structures 12 in the metal layer are arranged in the first direction with the first period, multiple pixel units 21 in the display function layer are arranged in the second direction with the second period, and the first period and the second period are in a relationship of an integral multiple. In this manner, the arrangement period 13 of the metal conductive structures 12 in the X3 direction and the arrangement period 23 of the pixel units 21 in the X3 direction are also in a relationship of an integral multiple. Based on this, no pattern visible to the human eye appears in the picture after the metal layer and the display function layer are bonded, and the moiré fringes in the picture after the metal layer and the display function layer are bonded are reduced.

In an exemplary embodiment, the first direction is the same as the second direction, and the arrangement direction of the period of multiple metal conductive structures is different from the arrangement direction of the period of multiple pixel units. The first period may be arranged to be a component of the period of the metal conductive structures in the first direction.

Figure 17:
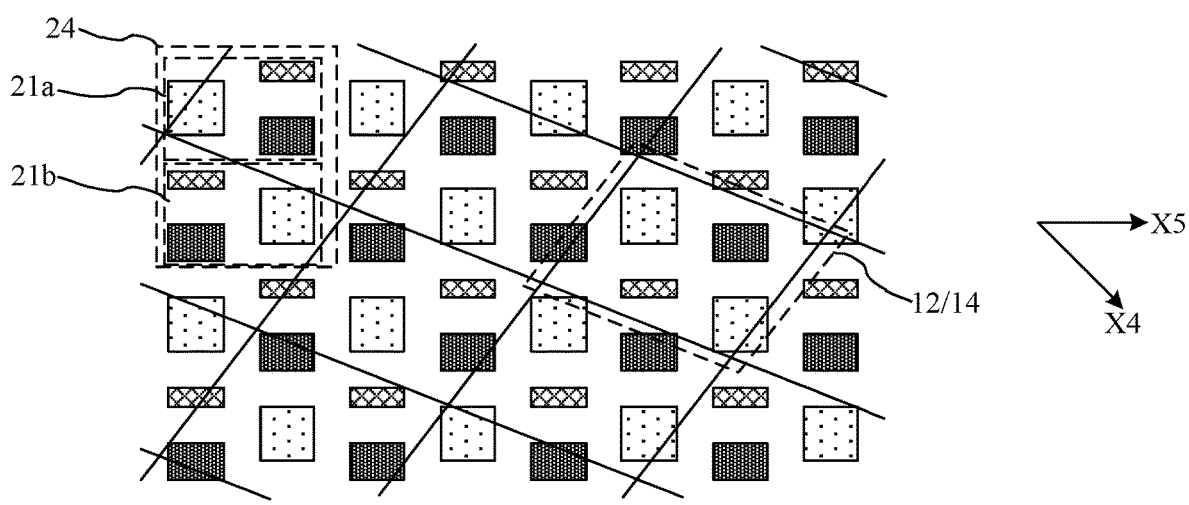
FIG. 17 is another schematic diagram of orthographic projections of the metal layer and the display function layer on the same plane.
Figure 18:
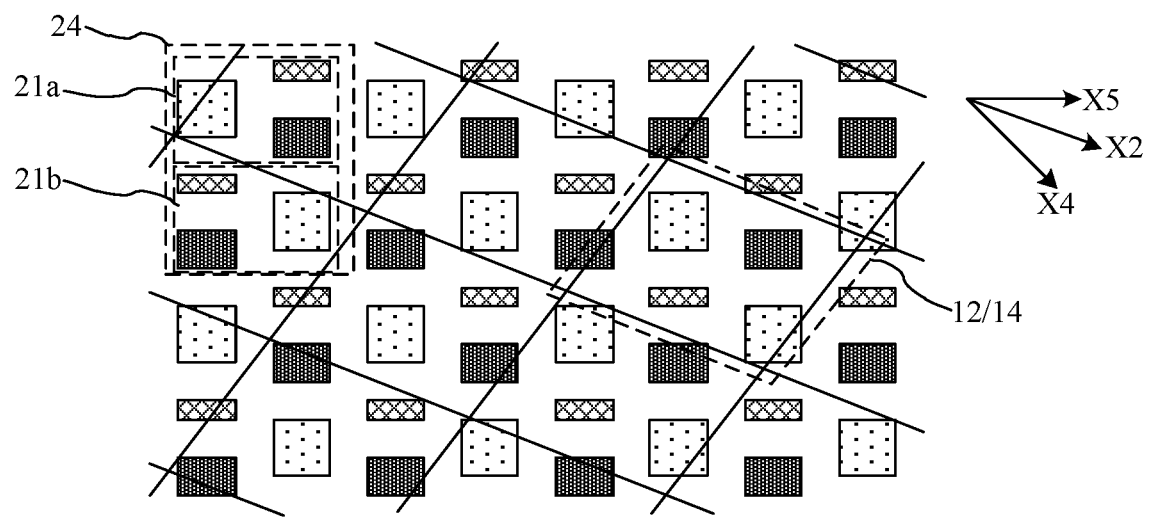
FIG. 18 is another schematic diagram of orthographic projections of the metal layer and the display function layer on the same plane.

Referring to FIG. 17, FIG. 17 is another schematic diagram of orthographic projections of the metal layer and the display function layer on the same plane. Referring to FIG. 18, FIG. 18 is another schematic diagram of orthographic projections of the metal layer and the display function layer on the same plane. As shown in FIGS. 17 and 18, in an exemplary embodiment, each metal conductive structure 12 is a mesh, multiple metal conductive structures 12 in the metal layer are arranged with a period 14, the display function layer includes first pixel units 21a and second pixel units 21b, one first pixel unit 21a and one second pixel unit 21b that are adjacent to each other form one period 24, and the arrangement direction X4 of the period of the metal conductive structures 12 is different from the arrangement direction X5 of the period of the pixel units.

As shown in FIG. 17, a second direction is selected, and the first direction and the second direction are both parallel to an X5 direction. The metal conductive structures 12 are arranged in the X4 direction with the period 14 so that the components of arrangement periods 14 of the metal conductive structures 12 in the X5 direction are also arranged periodically. The first pixel units 21a and the second pixel units 21b are arranged in the X5 direction with the period 24, and the period 24 may be the second period. The first direction is the same as the second direction, multiple metal conductive structures 12 in the metal layer are arranged in the first direction with the first period, multiple pixel units in the display function layer are arranged in the second direction with the second period, and the first period and the second period are in a relationship of an integral multiple. In this manner, the arrangement period 14 of the metal conductive structures 12 in the X4 direction and the arrangement period 24 of the pixel units in the X5 direction are also in a relationship of an integral multiple. Based on this, no pattern visible to the human eye appears in the picture after the metal layer and the display function layer are bonded, and the moiré fringes in the picture after the metal layer and the display function layer are bonded are reduced.

As shown in FIG. 18, a second direction is selected, the first direction is the same as the second direction, and the second direction X2 intersects the X4 direction. The metal conductive structures 12 are arranged in the X4 direction with the period 14 so that the components of arrangement periods 14 of the metal conductive structures 12 in the X2 direction are also arranged periodically. The first pixel units 21a and the second pixel units 21b are arranged in the X5 direction with the period 24 so that the components of arrangement periods 24 of the first pixel units 21a and the second pixel units 21b in the X2 direction are also arranged periodically. The first direction is the same as the second direction, multiple metal conductive structures 12 in the metal layer are arranged in the first direction with the first period, multiple pixel units in the display function layer are arranged in the second direction with the second period, and the first period and the second period are in a relationship of an integral multiple. In this manner, the arrangement period 14 of the metal conductive structures 12 in the X4 direction and the arrangement period 24 of the first pixel units 21a and the second pixel units 21b in the X5 direction are also in a relationship of an integral multiple. Based on this, no pattern visible to the human eye appears in the picture after the metal layer and the display function layer are bonded, and the moiré fringes in the picture after the metal layer and the display function layer are bonded are reduced.

By way of example, based on the preceding technical solutions, the period dimension of the period of multiple metal conductive structures may be less than or equal to 400 µm. The metal layer includes multiple metal conductive structures, the multiple metal conductive structures are arranged periodically, and the first period includes one or more metal conductive structures. A pattern period that can be distinguished by the human eye is greater than 400 µm, and the period dimension of the period of multiple metal conductive structures is less than or equal to 400 µm, that is, a first periodic dimension is less than or equal to 400 µm so that a periodic pattern of the metal layer is not recognized by the human eye.

The display function layer includes multiple pixel units, and the period dimension of the period of the pixel units is very small and is normally less than 400 µm. A pattern period that can be distinguished by the human eye is greater than 400 µm, and the period dimension of the period of multiple pixel units is less than or equal to 400 µm, that is, a second periodic dimension is less than or equal to 400 µm so that a periodic pattern of the display function layer is not recognized by the human eye.

The first period of the metal layer and the second period of the display function layer are in a relationship of an integral multiple so that the period of the pattern A generated after the metal layer and the display function layer are bonded is equal to the first period or the second period. In this manner, the period of the pattern A generated after the metal layer and the display function layer are bonded is less than or equal to 400 µm, and the pattern A is not recognized by the human eye. Therefore, the moiré fringes generated by the bonding of the metal layer and the display function layer in the display panel can be reduced.

In an exemplary embodiment, the pixel unit includes multiple sub-pixels; in a direction perpendicular to the metal layer, the orthographic projection of an opening area of the sub-pixel overlaps a metal conductive structure, and the overlapping area of the orthographic projection of an opening area of one of two sub-pixels of the same color and a metal conductive structure is the same as the overlapping area of the orthographic projection of an opening area of the other one of the two sub-pixels of the same color and a metal conductive structure.

In this embodiment, in the direction perpendicular to the metal layer, the orthographic projection of an opening area of the sub-pixel overlaps the metal conductive structure, and the overlapping area of the orthographic projection of an opening area of one of two sub-pixels of the same color and the metal conductive structure is the same as the overlapping area of the orthographic projection of an opening area of the other one of the two sub-pixels of the same color and the metal conductive structure. For the same metal conductive structure, if the metal conductive structure overlaps the opening areas of at least two sub-pixels of the same color, the area of an opening area of each of the at least two sub-pixels of the same color shielded by the metal conductive structure is the same.

Based on the above solution, the metal conductive structures of the metal layer can be arranged periodically. Therefore, the shielded patterns generated after the display function layer and the metal layer are bonded have periodicity. Specifically, the shielded patterns overlap the opening areas of multiple sub-pixels, and the shielded areas of the opening areas of the sub-pixels of the same color are the same. Therefore, the moiré fringes visible to the human eye generated by the bonding of the metal layer and the display function layer in the display panel can be reduced.

Based on this, if the density of the shielding periods in the shielded pattern is increased, for example, the dimension of the shielding period is less than or equal to 400 μm, then the moiré fringes in the picture after the metal layer and the display function layer are bonded can be further reduced.

In an exemplary embodiment, the pixel unit includes multiple sub-pixels, and the metal conductive structure is a metal wire or a mesh; the connection line of two sub-pixels of the same color is parallel to an extension direction of the metal wire, or the connection line of two sub-pixels of the same color is parallel to the connection line of two meshes.

Figure 19:
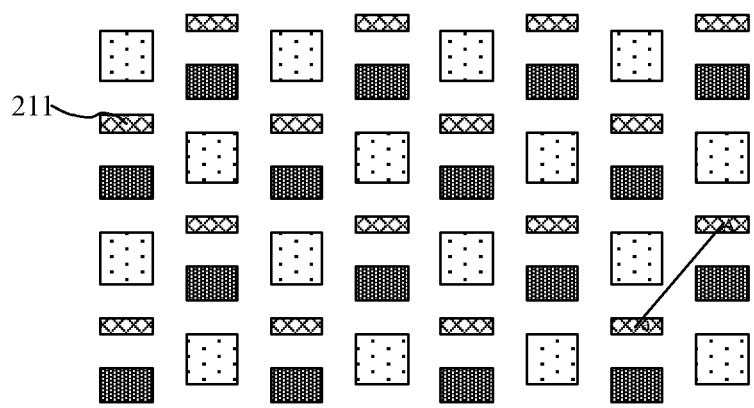
FIG. 19 is a top diagram of another display function layer of the display panel shown in FIG. 1.

Referring to FIG. 19, FIG. 19 is a top diagram of another display function layer of the display panel shown in FIG. 1. In an exemplary embodiment, the metal conductive structure is a metal wire, and the metal layer includes multiple metal wires. In conjunction with FIGS. 2 and 19, the extension direction of the metal wire is configured to be parallel to the connection line A-a of two sub-pixels 211 of the same color so that in the metal layer designed based on this solution, the metal conductive structures of the metal layer are arranged periodically.

Figure 20:
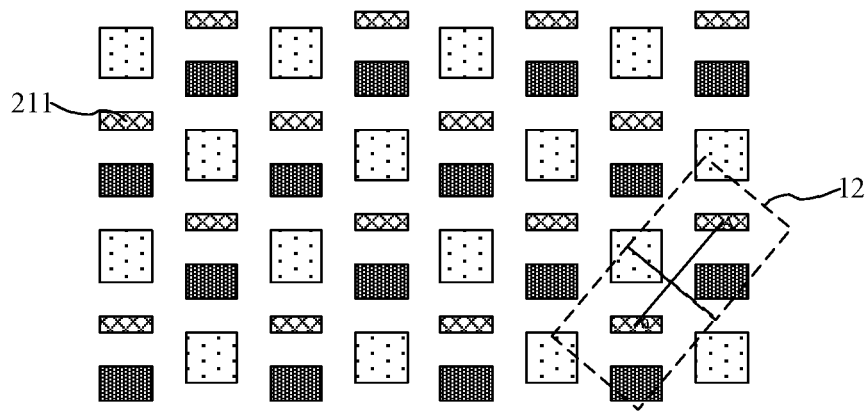
FIG. 20 is a top diagram of another display function layer of the display panel shown in FIG. 1.

Referring to FIG. 20, FIG. 20 is a top diagram of another display function layer of the display panel shown in FIG. 1. In an exemplary embodiment, the metal conductive structure 12 is a mesh, and multiple meshes in the metal layer are arranged periodically. As shown in FIG. 20, the connection line A-a of the two sub-pixels 211 of the same color is configured to be parallel to the connection line of two meshes 12 so that in the metal layer designed based on this solution, the metal conductive structures of the metal layer are arranged periodically.

The pixel units in the display function layer are arranged periodically, the metal conductive structures in the metal layer are arranged periodically, and the period of the metal conductive structures and the second period of the display function layer are in a relationship of an integral multiple so that the moiré fringes visible to the human eye generated by the bonding of the metal layer and the display function layer in the display panel can be reduced.

Figure 21:
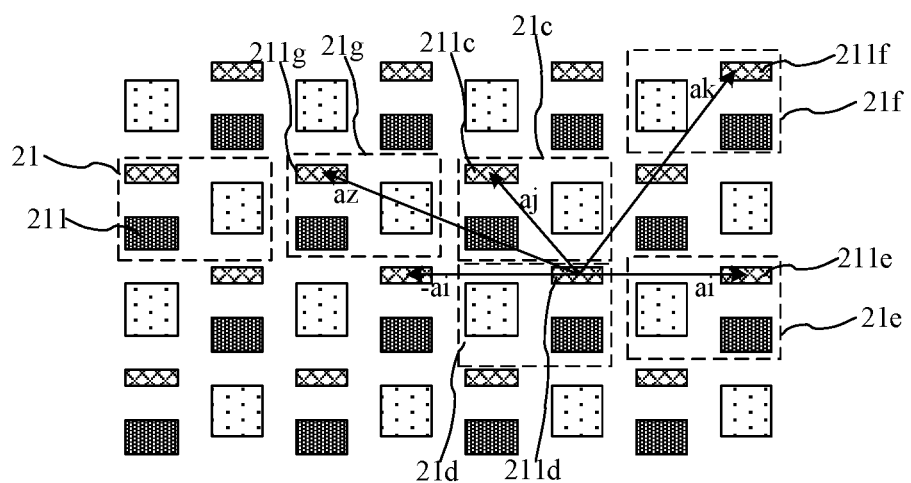
FIG. 21 is a top diagram of another display function layer of the display panel shown in FIG. 1.

By way of example, based on the preceding technical solutions, referring to FIG. 21, FIG. 21 is a top diagram of another display function layer of the display panel shown in FIG. 1. As shown in FIG. 21, in an exemplary embodiment, one pixel unit may include a first color sub-pixel, and the position $\vec{a}_k$ of the first color sub-pixel is expressed as $\vec{a}_k = m \cdot \vec{a}_i + n \cdot \vec{a}_j$, where m and n are both integers, the direction of a, intersects the direction of $\vec{a}_j$, $\vec{a}_i$ is the position of a first color sub-pixel of another pixel unit, and $\vec{a}_j$ is the position of a first color sub-pixel of still another pixel unit. $\vec{a}_k$, $\vec{a}_i$, and $\vec{a}_j$ have the same vector starting point, and the vector starting point is a first color sub-pixel of one pixel unit different from the preceding three pixel units.

The display function layer includes multiple pixel units 21. The pixel unit 21 includes multiple sub-pixels 211 of different colors. The pixel unit 21 may include a first color sub-pixel, a second color sub-pixel, and a third color sub-pixel. For example, the pixel unit 21 includes R, G, and B.

Three non-collinear and adjacent pixel units are selected. The three non-collinear pixel units refer to three pixel units which are not located in the same column or the same row at the same time. For example, the selected three non-collinear and adjacent pixel units are 21c, 21d, and 21e. The pixel unit 21c includes a first color sub-pixel 211c, the pixel unit 21d includes a first color sub-pixel 211d, and the pixel unit 21e includes a first color sub-pixel 211e.

The first color sub-pixel 211d of the pixel unit 21d is configured as the vector starting point, that is, a reference point. In this manner, the vector position of the first color sub-pixel 211e relative to the reference point is $\vec{a}_i$, and the vector position of the first color sub-pixel 211c relative to the reference point is $\vec{a}_j$. Therefore, the position $\vec{a}_k$ of any other first color sub-pixel in the display function layer can be expressed as $\vec{a}_k = m \cdot \vec{a}_i + n \cdot \vec{a}_j$. For example, in the position $\vec{a}_k$ of the first color sub-pixel 211f, m=2 and n=1.

Figure 22:
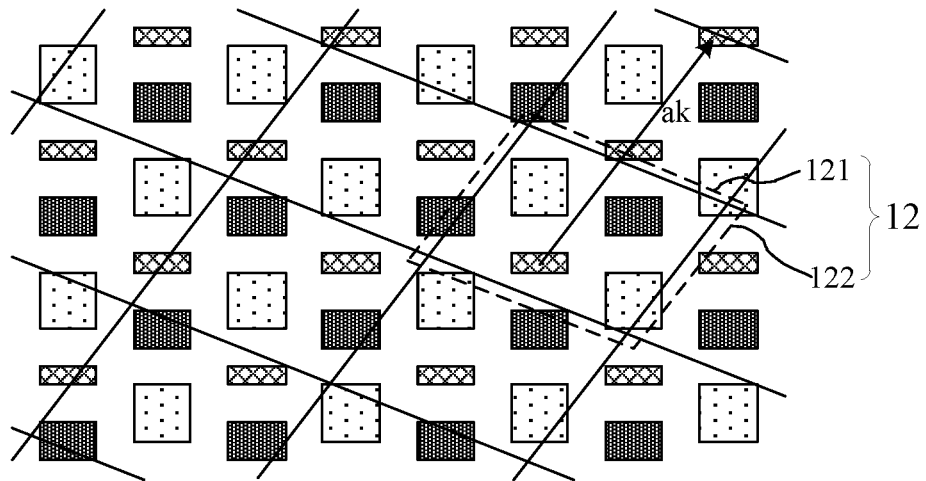
FIG. 22 is another schematic diagram of orthographic projections of the metal layer and the display function layer on the same plane.

Referring to FIG. 22, FIG. 22 is another schematic diagram of orthographic projections of the metal layer and the display function layer on the same plane. As shown in FIG. 22, in an exemplary embodiment, the metal conductive structures 12 are meshes defined by the intersection of the first metal wires 121 and the second metal wires 122, and the first metal wires 121 are parallel to $\vec{a}_k$. If the metal conductive structure 12 is a mesh, one metal wire 121 of the mesh is parallel to $\vec{a}_k$. In the metal layer designed based on this solution, it can be achieved that the metal conductive structures 12 of the metal layer are arranged periodically, and the first period of the metal layer and the second period of the display function layer are in a relationship of an integral multiple.

Figure 23:
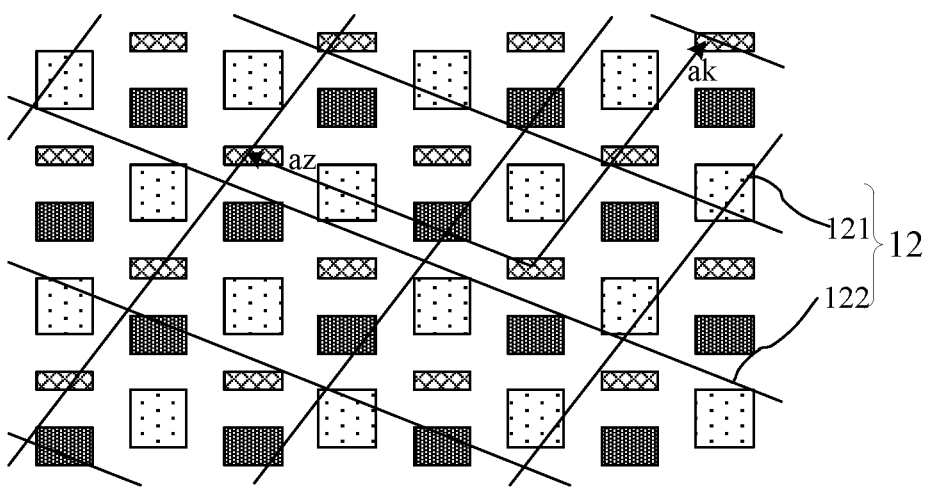
FIG. 23 is another schematic diagram of orthographic projections of the metal layer and the display function layer on the same plane.

Referring to FIG. 23, FIG. 23 is another schematic diagram of orthographic projections of the metal layer and the display function layer on the same plane. As shown in FIGS. 21 and 23, in an exemplary embodiment, the extension direction of the second metal wire 122 is parallel to the position $\vec{a}_z$ of a first color sub-pixel 211g, and $\vec{a}_z = -p \cdot \vec{a}_i + q \cdot \vec{a}_j$, where p and q are both integers.

The first color sub-pixel 211d of the pixel unit 21d is configured as the vector starting point, that is, a reference point, the vector position of the first color sub-pixel 211g relative to the reference point is $\vec{a}_z$, and $\vec{a}_z = -p \cdot \vec{a}_i + q \cdot \vec{a}_j$. For example, in the position $\vec{a}_z$ of the first color sub-pixel 211g, p=2 and q=1. In other embodiments, p=m and q=n.

In the metal layer designed based on this solution, the opening areas of the sub-pixels of the same color are distributed in a parallelogram shape, and then the extension direction of the metal wire is designed according to the arrangement of the sub-pixels so that the metal conductive structures 11 of the metal layer are arranged periodically, and the first period of the metal layer and the second period of the display function layer are in a relationship of an integral multiple. Further, in the metal layer designed based on this solution, the overlapping area of the metal conductive structures of the metal layer and the opening areas of the sub-pixels can be reduced as much as possible, or the following condition is satisfied: the shielded areas of the opening areas of the sub-pixels of the same color are the same. In this manner, the moiré fringes can be reduced.

Figure 24:
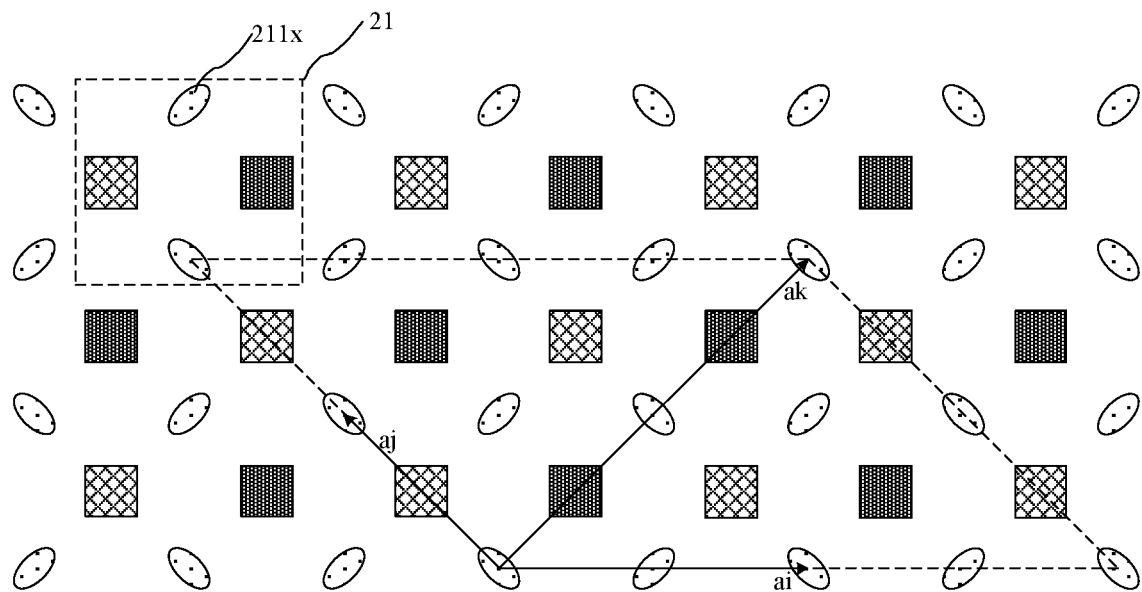
FIG. 24 is a top diagram of another display function layer of the display panel shown in FIG. 1.

Referring to FIG. 24, FIG. 24 is a top diagram of another display function layer of the display panel shown in FIG. 1. It is to be noted that if the pixel unit 21 includes two or more second color sub-pixels 211x, then after three non-collinear and adjacent pixel units 21 are selected, the second color sub-pixels 211x with the same position relationship are selected from the three non-collinear and adjacent pixel units 21, and a vector is established so that the extension direction of the metal wire can be determined. The extension direction of a metal wire may be parallel to $\vec{a}_k$. If the metal conductive structure is a mesh surrounded by the metal wires, the extension direction of another metal wire of the mesh may be parallel to $\vec{a}_j$, and of course, the extension direction of another metal wire of the mesh may also intersect $\vec{a}_i$, which is not limited to this. This solution may also be understood as follows: two sub-pixels of the same color and with the same position relationship in the display function layer are selected, and the connection line of the two sub-pixels is provided to be parallel to the extension direction of the metal wire.

The line width between the metal wires in the metal layer may be less than 10 µm so that the overlapping area of the metal conductive structures and the opening areas of the sub-pixels can be reduced, and thus the display effect can be improved.

It is to be understood that, in the display panel provided in embodiments of the present disclosure, the pixel units of the display function layer may be arranged periodically as shown in FIG. 5, or may be arranged periodically as shown in FIG. 7, and is not limited to this. Any display function layer provided with pixel units arranged periodically falls into the scope of the present disclosure.

By way of example, based on the preceding technical solution, in an exemplary embodiment, the metal conductive structure is a metal wire or a mesh defined by the intersection of the metal wires. The metal wire is formed by connecting several metal line segments. The angle between the linear fitted extension direction of the metal wire and the extension direction of each metal line segment in the metal wire is less than or equal to 10°.

Figure 25:
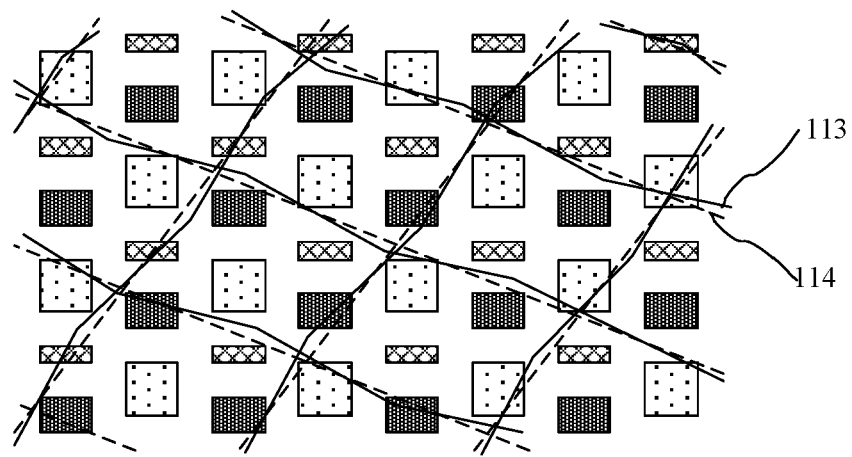
FIG. 25 is another schematic diagram of orthographic projections of the metal layer and the display function layer on the same plane.

Referring to FIG. 25, FIG. 25 is another schematic diagram of orthographic projections of the metal layer and the display function layer on the same plane. As shown in FIG. 25, in an exemplary embodiment, the metal conductive structure is a mesh defined by the intersection of the metal wires, and the metal wire 113 is formed by connecting several metal line segments with not exactly the same extension directions. A fitted line 114 of the metal wire 113 is obtained by linearly fitting several metal line segments in the metal wire 113. The fitted line 114 is a straight line, the extension direction of the fitted line 114 is the fitted extension direction of the metal wire 113, and the fitted extension direction of the metal wire 113 may also be regarded as the overall direction of the metal wire 113.

As mentioned above, the metal wire is formed by connecting multiple metal line segments, and the overall extension directions of several metal line segments in the metal wire are the same. In this manner, to adapt to different sub-pixel structures, the small angle between the metal line segment and the fitted line may be adjusted appropriately according to the opening area of the sub-pixel such that the area of the opening area of the sub-pixel shielded by the metal line segment is reduced; or the metal line segment is located between opening areas of two adjacent sub-pixels.

The process of obtaining the fitted line 114 by linearly fitting several metal line segments in the metal wire 113 is as follows: coordinates of two endpoints of each metal line segment in the metal wire 113 are obtained, and then at least three pieces of coordinate data may be obtained in one metal wire 113; according to the at least three pieces of coordinate data, a fitted line 114 of the metal wire 113 can be obtained by linear fitting. The principle of linear fitting is similar to that in the related art and will not be repeated herein.

For one metal wire 113, the extension direction of the fitted line 114 of the metal wire 113 intersects or overlaps each metal line segment in the metal wire 113, and the angle between the fitted line 114 and the metal line segment may be less than or equal to 10°. If the angle between the fitted line 114 and the metal line segment is too large, then the shape difference of different metal conductive structures may be too different, which affects the periodicity of the metal conductive structures in the metal layer and may cause the moiré fringes.

Based on this, when the metal wire is designed, the extension direction of the fitted line may be determined in advance. Based on this, the metal wire is divided into several metal line segments. A small angle may be added due to the routing direction of each metal line segment in the metal wire. The small angle is the angle between the metal line segment and the fitted line, and the small angle θ satisfies −10°<θ<10°. The angle θ is configured to satisfy −10°<θ<10° so that the following case can be avoided: the angle between the metal line segment and the overall extension direction of the metal wire is too large to affect the periodicity of the metal conductive structures. It is to be understood that, according to different product structures, based on the condition that the periodicity of the metal conductive structures is not affected, the range of θ may be changed, such as exceeding −10°<θ<10° or within −10°<θ<10°, which is not limited to this.

In an exemplary embodiment, the pixel unit includes multiple sub-pixels; the orthographic projection of the metal line segment on the display function layer is located between two adjacent sub-pixels.

As mentioned above, the metal wire is formed by connecting multiple metal line segments, and the overall extension directions of several metal line segments in the metal wire are the same. Based on the condition that it is ensured that the small angle between the metal line segment and the overall extension direction of the metal wire satisfies −10°<θ<10°, to adapt to different sub-pixel structures, the small angle between the metal line segment and the fitted line may be adjusted appropriately according to the opening area of the sub-pixel. For example, the small angle θ between the metal line segment and the fitted line is adjusted such that the area of the opening area of the sub-pixel shielded by the metal line segment is reduced; the small angle θ between the metal line segment and the fitted line is adjusted such that the metal line segment is located between opening areas of two adjacent sub-pixels.

Figure 26:
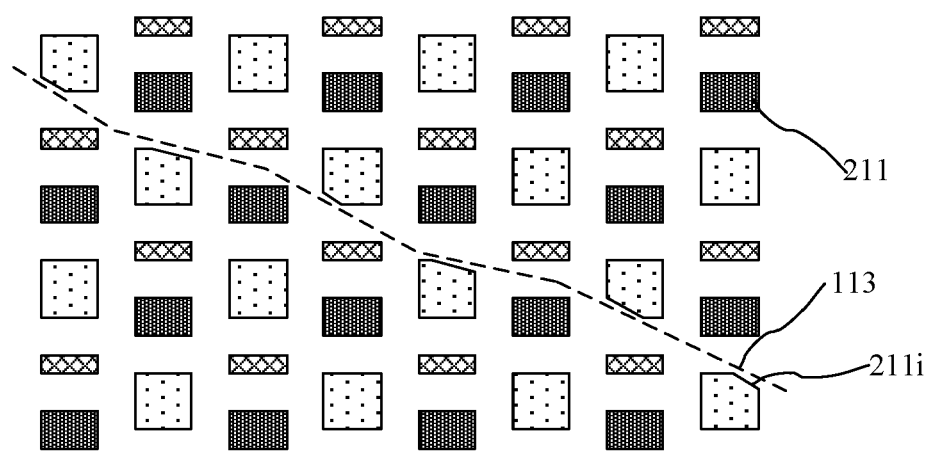
FIG. 26 is a schematic diagram of a projection of a metal wire of the display panel shown in FIG. 1 on the display function layer.

Referring to FIG. 26, FIG. 26 is a schematic diagram of a projection of a metal wire of the display panel shown in FIG. 1 on the display function layer. As shown in FIG. 26, in an exemplary embodiment, the sub-pixel 211 includes an opening area and a non-opening area; the orthographic projection of a metal line segment on the display function layer is located in the non-opening area between two adjacent sub-pixels, each of the opening areas of the two adjacent sub-pixels is provided with one first side, the first sides of the opening areas of the two adjacent sub-pixels are oppositely disposed, and each of the first sides is parallel to a metal line segment adjacent to the each of the first sides. In an example embodiment, only one metal line segment is provided between the opening areas of two adjacent sub-pixels, and the first sides of the opening areas of the two adjacent sub-pixels are oppositely disposed and are parallel to the only one metal line segment.

In this embodiment, the illustrated sub-pixel 211 area represents the opening area of the sub-pixel, and the area between the opening areas of adjacent sub-pixels 211 is the non-opening area of the sub-pixel. The metal wire 113 is actually an orthographic projection of the metal wire in the metal layer on the display function layer, and the metal wire 113 is formed by several metal line segments. The small angle θ between the metal line segment and the fitted line corresponding to the metal line segment is adjusted such that the orthographic projection of the metal line segment on the display function layer is located in the non-opening area between two adjacent sub-pixels 211.

Each of the opening areas of two adjacent sub-pixels 211 located on two sides of the metal line segment is provided with one first side 211$i$, and the first sides 211$i$ of the opening areas of the two adjacent sub-pixels 211 are oppositely disposed parallel to the metal line segment. The shape of the opening area of the sub-pixel is designed, that is, the opening area is provided with the first side, and the routing positions for the metal wires are reserved between two adjacent sub-pixels so that the orthographic projection of the metal line segment on the display function layer is located in the non-opening area of the two adjacent sub-pixels 211, the metal line segment does not shield the opening area of the sub-pixel, and thus the display effect can be improved.

Based on the same inventive concept, embodiments of the present disclosure further provide a display device. The display device includes the display panel described in any of the preceding embodiments. For example, the display panel is an organic light-emitting display panel and is not limited thereto.

In this embodiment, the display panel includes a display function layer, and pixel units of the display function layer are arranged in a second direction with a second period. The display panel further includes a metal layer located between the display function layer and a display surface of the display panel. Metal conductive structures of the metal layer are arranged in a first direction with a first period, and the first period and the second period are in a relationship of an integral multiple so that moiré fringes can be reduced.

The metal conductive structures of the metal layer are arranged periodically, and the pixel units of the display function layer are arranged periodically, and the first period and the second period of the two are in a relationship of an integral multiple. The metal layer is disposed in the display panel by in-screen bonding. In this manner, the stacking of film layers in the display panel can be reduced, and a higher fault tolerance rate can be achieved when the metal layer and the display function layer are bonded so that the manufacturing difficulty can be reduced.

It is to be noted that the preceding are only preferred embodiments of the present disclosure and the technical principles used therein. It will be appreciated by those skilled in the art that the present disclosure is not limited to the embodiments described herein. For those skilled in the art, various apparent modifications, adaptations, combinations, and substitutions can be made without departing from the scope of the present disclosure. Therefore, while the present disclosure has been described in detail via the preceding embodiments, the present disclosure is not limited to the preceding embodiments and may include more equivalent embodiments without departing from the inventive concept of the present disclosure. The scope of the present disclosure is determined by the scope of the appended claims.

What is claimed is:

1. A display panel, comprising:
a metal layer, wherein the metal layer comprises a plurality of metal conductive structures, and the plurality of metal conductive structures are arranged with a period, and are arranged in a first direction with a first period; and
a display function layer, wherein the display function layer comprises a plurality of pixel units, and the plurality of pixel units are arranged with a period, and are arranged in a second direction with a second period,
wherein the metal layer is located between the display function layer and a display surface of the display panel, and the first period and the second period are in a relationship of an integral multiple,
wherein one of the plurality of pixel units comprises a first color sub-pixel, and a position $\vec{a}_k$ of the first color sub-pixel is expressed as follows:

$$\vec{a}_k = m \cdot \vec{a}_i + n \cdot \vec{a}_j,$$

wherein m and n are both integers, a direction of a, intersects a direction of $\vec{a}_j$, $\vec{a}_i$ is a position of a first color sub-pixel of another one of the plurality of pixel units, and $\vec{a}_j$ is a position of a first color sub-pixel of still another one of the plurality of pixel units, $\vec{a}_k$, $\vec{a}_i$, and $\vec{a}_j$ have a same vector starting point, and the vector starting point is a first color sub-pixel of one pixel unit of the plurality of pixel units, the one pixel unit being different from the one of the plurality of pixel units, the another one of the plurality of pixel units and the still another one of the plurality of pixel units.

2. The display panel of claim 1, wherein each of the plurality of metal conductive structures is a metal wire.

3. The display panel of claim 1, wherein the metal layer comprises a metal grid, the metal grid comprises a plurality of meshes, and each of the plurality of metal conductive structures is one of the plurality of meshes.

4. The display panel of claim 1, wherein the plurality of metal conductive structures comprise first minimum repeating units, and each of the first minimum repeating units forms one period; and
the first period comprises one or more of the first minimum repeating units.

5. The display panel of claim 1, wherein each of the plurality of pixel units comprises a plurality of sub-pixels;
the sub-pixels of the display function layer include second minimum repeating units, and each of the second minimum repeating units forms one period; and
the second period comprises one or more of the second minimum repeating units.

6. The display panel of claim 1, wherein the plurality of metal conductive structures comprise first repeating units, and the first repeating units are arranged periodically;
the plurality of pixel units comprise second repeating units, and the second repeating units are arranged with a period; and
a contour of each of the first repeating units is the same as a contour of each of the second repeating units.

7. The display panel of claim 6, wherein each of the first repeating units comprises an array of m×n metal conductive structures; and
each of the plurality of pixel units comprises a plurality of sub-pixels, and each of the second repeating units comprises n columns of sub-pixels in a row direction and m rows of sub-pixels in a column direction.

8. The display panel of claim 1, wherein the first direction is the same as the second direction.

9. The display panel of claim 1, wherein each of the plurality of pixel units comprises a plurality of sub-pixels, and the plurality of metal conductive structures are metal wires or meshes; and a connection line of two of the plurality of sub-pixels of the same color is parallel to an extension direction of a respective one of the metal wires, or a connection line of two of the plurality of sub-pixels of the same color is parallel to a connection line of two of the meshes.

10. The display panel of claim 8, wherein an arrangement direction of the period of the plurality of metal conductive structures is different from an arrangement direction of the period of the plurality of pixel units, wherein the first period is arranged to be a component of the period of the plurality of metal conductive structures in the first direction.

11. The display panel of claim 1, wherein a period dimension of the period of the plurality of metal conductive structures is less than or equal to 400 μm.

12. The display panel of claim 1, wherein each of the plurality of pixel units comprises a plurality of sub-pixels; and in a direction perpendicular to the metal layer, an orthographic projection of an opening area of a sub-pixel of the plurality of sub-pixels overlaps a metal conductive structure of the plurality of metal conductive structures, and opening areas of two of the plurality of sub-pixels of the same color have a same overlapping area with a metal conductive structure of the plurality of metal conductive structures.

13. The display panel of claim 1, wherein each of the plurality of metal conductive structures is a metal wire, and an extension direction of the metal wire is parallel to $\vec{a}_k$.

14. The display panel of claim 1, wherein each of the plurality of metal conductive structures is a mesh defined by intersection of a first metal wire and a second metal wire, and the first metal wire is parallel to $\vec{a}_k$, wherein an extension direction of the second metal wire is parallel to a position $\vec{a}_z$ of one first color sub-pixel, and $\vec{a}_z = -p \cdot \vec{a}_i + q \cdot \vec{a}_j$, wherein p and q are both integers.

15. The display panel of claim 14, wherein p=m and q=n.

16. The display panel of claim 1, wherein each of the plurality of metal conductive structures is a metal wire or a mesh defined by intersection of metal wires, the metal wire is formed by connecting several metal line segments, and an angle between a linear fitted extension direction of the metal wire and an extension direction of each of the several metal line segments in the metal wire is less than or equal to 10°, wherein each of the plurality of pixel units comprises a plurality of sub-pixels; and an orthographic projection of each of the several metal line segments on the display function layer is located between two adjacent ones of the plurality of sub-pixels.

17. The display panel of claim 16, wherein each of the plurality of sub-pixels further comprises an opening area and a non-opening area; and the orthographic projection of each of the several metal line segments on the display function layer is located in a non-opening area between the two adjacent ones of the plurality of sub-pixels, each of opening areas of two adjacent ones of the plurality of sub-pixels is provided with one first side, the first sides of the opening areas of the two adjacent ones of the plurality of sub-pixels are oppositely disposed, and each of the first sides is parallel to a respective one of the several metal line segments that is adjacent to the each of the first sides.

18. The display panel of claim 1, wherein the metal layer is a touch electrode layer; or the metal layer is an antenna layer.

19. A display device comprising the display panel of claim 1.

* * * * *